(12) United States Patent
Jo et al.

(10) Patent No.: US 8,898,543 B2
(45) Date of Patent: Nov. 25, 2014

(54) NONVOLATILE MEMORY DEVICE, SYSTEM, AND METHOD PROVIDING FAST PROGRAM AND READ OPERATIONS

(75) Inventors: Sung-Kyu Jo, Yongin-si (KR); Yong-Tae Yim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 992 days.

(21) Appl. No.: 12/190,855

(22) Filed: Aug. 13, 2008

(65) Prior Publication Data

US 2009/0049364 A1    Feb. 19, 2009

(30) Foreign Application Priority Data

Aug. 16, 2007 (KR) .................. 10-2007-0082330

(51) Int. Cl.
| | |
|---|---|
| G06F 11/00 | (2006.01) |
| G06F 11/10 | (2006.01) |
| G11C 16/04 | (2006.01) |
| H03M 13/35 | (2006.01) |
| H03M 13/00 | (2006.01) |
| G11C 11/56 | (2006.01) |
| H03M 13/09 | (2006.01) |
| H03M 13/13 | (2006.01) |
| G11C 29/00 | (2006.01) |

(52) U.S. Cl.
CPC ......... *H03M 13/356* (2013.01); *G06F 11/1072* (2013.01); *G11C 16/0483* (2013.01); *H03M 13/098* (2013.01); *H03M 13/13* (2013.01); *H03M 13/6306* (2013.01); *G11C 2211/5641* (2013.01); *G11C 11/5628* (2013.01); *G11C 11/5642* (2013.01); *G11C 29/00* (2013.01)
USPC .......................................... 714/764; 714/721

(58) Field of Classification Search
CPC ............ G06F 12/0676; G06F 13/1668; G06F 13/4243; G06F 3/0613; G06F 3/0659; G06F 3/0679; G06F 13/1694; G06F 11/073; G06F 11/0754; G06F 11/1072; G06F 11/1068; G06F 11/2205; G06F 11/2284; G06F 11/327; G06F 12/00; G06F 12/0223
USPC .................................. 714/721, 758, 764, 774
See application file for complete search history.

(56) References Cited

U.S. PATENT DOCUMENTS

| | | | | |
|---|---|---|---|---|
| 7,590,003 B2 * | 9/2009 | Jo et al. | ..................... | 365/185.17 |
| 7,673,220 B2 * | 3/2010 | Kim et al. | ..................... | 714/773 |
| 7,814,401 B2 * | 10/2010 | Alrod et al. | ..................... | 714/794 |

(Continued)

FOREIGN PATENT DOCUMENTS

| | | |
|---|---|---|
| JP | 0616906 A | 6/1994 |
| JP | 06187248 A | 7/1994 |

(Continued)

*Primary Examiner* — Bryce Bonzo
*Assistant Examiner* — Elmira Mehrmanesh
(74) *Attorney, Agent, or Firm* — Volentine & Whitt, PLLC

(57) ABSTRACT

Disclosed are program and read methods for a nonvolatile memory system, including determining to program first data in which one of fast and normal modes; providing the first data with an error code generated by a multi-bit ECC engine, in the fast mode, and generating second data; programming the second data in a cell array by a program voltage having a second start level higher than a first start level; and reading the second data from the cell array, the second data being output after processed by the multi-bit ECC engine that detects and corrects an error from the second data.

47 Claims, 14 Drawing Sheets

(56) References Cited

U.S. PATENT DOCUMENTS

| | | | |
|---|---|---|---|
| 7,900,102 B2 * | 3/2011 | Sokolov et al. | 714/719 |
| 8,085,586 B2 * | 12/2011 | Golov et al. | 365/185.03 |
| 2004/0083333 A1 | 4/2004 | Chang et al. | |
| 2005/0248992 A1 | 11/2005 | Hwang et al. | |
| 2006/0120165 A1 | 6/2006 | Hemink | |
| 2006/0279984 A1 | 12/2006 | Seta et al. | |
| 2007/0025151 A1 * | 2/2007 | Lee | 365/185.11 |
| 2007/0025161 A1 * | 2/2007 | Park et al. | 365/189.05 |
| 2007/0028155 A1 * | 2/2007 | Kim et al. | 714/755 |
| 2007/0070701 A1 | 3/2007 | Kim et al. | |
| 2007/0104004 A1 * | 5/2007 | So et al. | 365/203 |
| 2007/0266291 A1 | 11/2007 | Toda et al. | |
| 2007/0291536 A1 * | 12/2007 | Kang | 365/185.2 |
| 2007/0297245 A1 * | 12/2007 | Mokhlesi | 365/185.28 |
| 2008/0253182 A1 | 10/2008 | Kim et al. | |
| 2009/0067257 A1 * | 3/2009 | Lee et al. | 365/185.33 |

FOREIGN PATENT DOCUMENTS

| | | |
|---|---|---|
| JP | 2004164634 A | 6/2004 |
| JP | 2005322248 A | 11/2005 |
| JP | 2007087569 A | 4/2007 |
| JP | 2007207376 A | 8/2007 |
| JP | 2007305267 A | 11/2007 |
| KR | 1020070014470 A | 2/2007 |

* cited by examiner

NONVOLATILE MEMORY DEVICE, SYSTEM, AND METHOD PROVIDING FAST PROGRAM AND READ OPERATIONS

CROSS-REFERENCE TO RELATED APPLICATIONS

This U.S. non-provisional patent application claims priority under 35 U.S.C. §119 to Korean Patent Application No. 10-2007-82330 filed on Aug. 16, 2007, the subject matter of which is hereby incorporated by reference.

BACKGROUND

The present invention relates generally to semiconductor memory devices, and more particularly to a nonvolatile memory devices, systems and method of performing read and program operations.

Semiconductor memory devices may be classified as volatile and nonvolatile in the operative nature. Volatile semiconductor memory devices are generally characterized by high speed read and write operations, but lose stored data in the absence of applied power. In contrast, nonvolatile semiconductor memory devices retain stored data in the absence of applied power. Thus, the nonvolatile semiconductor devices are widely used in applications requiring data retention regardless of power supply state. There are many kinds of nonvolatile semiconductor memories, including as examples, mask read-only memories (MROMs), programmable ROMs (PROMs), erasable and programmable ROMs (EPROMs), electrically erasable and programmable ROMs (EEPROMs), etc.

However, MROMs, PROMs, and EPROMs do not allow ready update of stored data, since these memory types are not easily erased and written to. In contrast, data may be easily erased from and programmed to EEPROMs. As a result, EEPROMs are increasingly used in subsidiary data storage units and/or system programming tools where constant data updates are often required. Flash memory is one particular type of EEPROM that may be fabricated with much higher integration density than other types of EEPROMs. This characteristic makes flash memory ideal for use in applications like high-capacity subsidiary data storage units. Within the general category of flash type EEPROMs, NAND-type flash EEPROMs (hereinafter, referred to as "NAND flash memory") is very advantageous in its great integration density, as compared to other types of the flash EEPROMs.

Like all semiconductor memories, flash memory is a particular form of integrated circuitry capable of receiving and storing (programming) digital data, and thereafter accessing and providing the stored data (reading). A flash memory device comprises an array of memory cells, where each memory cell is uniquely capable of storing data and providing the stored data upon request. Each memory cell may store a single bit (1-bit) of data or multiple bits (multi-bit) of data. Where 1-bit data is stored in a memory cell, the memory cell is conditioned in one of two threshold voltage distributions corresponding respectively to one of two data states '1' and '0'. Where 2-bit data is stored in a memory cell, the memory cell is conditioned in one of four threshold voltage distributions each corresponding to one of four data states '11', '10', '01', and '00'. Similarly, where 3-bit data is stored in a memory cell, the memory cell is conditioned in one of eight threshold voltage distributions each corresponding to one of eight data states '111' through '000'. More recently, 4-bit flash memory cells are being investigated.

Various programming methodologies have been proposed for the programming of flash memory cells. The speed (i.e., the programming rate) and accuracy of these programming methods is very important to the overall operation of flash memory devices. Therefore, enhancing the programming rate is one important consideration in the further improvement of memory device and memory system performance.

In relation to flash memory devices, the so-called incremental step-pulse programming (ISPP) mode of programming memory cells has been used with good results. The ISPP mode operates to shift a flash memory cell towards a target threshold voltage by applying gradually increasing step pulses to a corresponding word line. Thus, the programming rate of an ISPP mode programming method is determined in part by the number of steps used. Reducing the number of incremental programming steps will increase the programming rate and help prevent over-programming of flash memory cells.

SUMMARY OF THE INVENTION

Accordingly, embodiments of the invention enjoy an increased programming rate while preventing degradations in reliability caused by over-programming within a nonvolatile memory device and system.

In one embodiment, the invention provides a method operable within a nonvolatile memory system including a memory cell array, the method comprising; receiving a programming command including program data and indicating execution of the programming command using a fast programming mode or a normal programming mode, if the fast programming mode is indicated, activating a multi-bit Error Detection and/or Correction (ECC) engine to generate multi-bit ECC code in relation to the program data and storing the program data and multi-bit ECC data in the memory cell array, and if the normal programming mode is indicated, activating a single bit ECC engine to generate single bit ECC code in relation to the program data and storing the program data and single bit ECC data in the memory cell array.

In a related aspect, the method may further include; if the normal programming mode is indicated, generating a program voltage beginning at a first start voltage and using the program voltage to store the program data and the single bit ECC data in the memory cell array, and if the fast programming mode is indicated generating the program voltage beginning at a second start voltage higher than the first start voltage and using the program voltage to store the program data and the multi-bit ECC data in the memory cell array.

In another embodiment, the invention provides a method operable within a nonvolatile memory system including a memory cell array, the method comprising; receiving a read command indicating read data stored in the memory cell array and further indicating execution of the read command using a fast read mode or a normal read mode, if the fast read mode is indicated, activating a multi-bit Error Detection and/or Correction (ECC) engine to detect/correct an error bit in the read data using multi-bit ECC code stored in the memory cell array, and if the normal read mode is indicated, activating a single bit ECC engine to detect/correct an error bit in the read data using single bit ECC code stored in the memory cell array.

In another embodiment, the invention provides a system comprising; a host configured to provide a programming command including program data and indicating execution of a programming operation associated with the program data in either a fast programming mode or a normal programming mode, and a flash memory device configured to either execute the programming operation in the normal mode by generating single bit Error Detection and/or Correction (ECC) code associated with the program data, and storing the program data and single bit ECC data in a memory cell array using a first program voltage having a first start voltage, or execute the programming operation in the fast mode by generating multi-bit ECC code associated with the program data, and storing the program data and multi-bit ECC data in the memory cell array using a second program voltage having a second start voltage higher than the first start voltage.

In another embodiment, the invention provides a flash memory device comprising; a memory cell array having memory cells divided into a first area and a second area, an address comparator generating a flag signal upon determining that an address associated with a read operation corresponds to the first area, a high voltage generator providing unselected word lines of the memory cell array with a reduced unselective read voltage or an elevated unselective read voltage, during the read operation in relation to the flag signal, a page buffer sensing bit lines of the memory cell array using a first bit-line sensing period or a second bit-line sensing period longer than the first bit-line sensing period during the read operation, an ECC block detecting and/or correcting an error in the read data as provided by the page buffer and generating a read fail signal if a number of error bits in the error exceeds a correction capacity of the ECC block, and a state machine controlling the high voltage generator and the page buffer in response to the flag signal and the read fail signal.

BRIEF DESCRIPTION OF THE FIGURES

Embodiments of the invention will be described with reference to the following figures, wherein like reference numerals refer to like or similar elements. In the figures.

DESCRIPTION OF EMBODIMENTS

Embodiments of the invention will be described below in the context of a NAND-type flash memory device as examples illustrating structural and operational features by the invention.

The present invention may, however, be embodied in different forms and should not be constructed as being limited to only the illustrated embodiments. Rather, these embodiments are provided as teaching examples.

Figure 1:
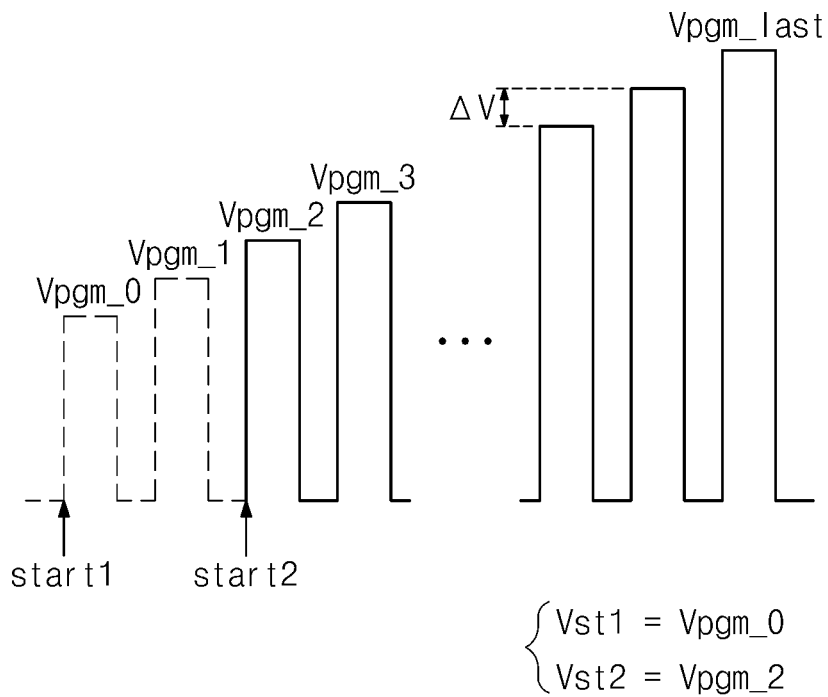
FIG. 1 is a waveform diagram of a program start voltage according to an embodiment of the invention.

FIG. 1 is a waveform diagram of a program start voltage according to an embodiment of the invention. Referring to FIG. 1, in a programming operation, a program voltage Vpgm applied to a word line of a memory cell is increased by a step voltage $\Delta V$ for each incremental programming loop. The program voltage Vpgm is raised gradually until a last program voltage Vpgm_last is applied to the memory cell during a last programming loop.

To increase the overall programming rate for a constituent flash memory device, it is necessary to decrease the number of programming loops. Hence, the last program voltage Vpgm_last is set at a level minimally capable of meeting the basic conditions for successful programming a selected and properly operating memory cell. In order to reduce the number of programming loops, it is also advantageous to adjust a level of the program start voltage Vstart. The program start voltage Vstart may be set to be one of a first or second start voltages Vst1 and Vst2. In the illustrated embodiment of FIG. 1, the first and second start voltages Vst1 and Vst2 are different from each other and separated by levels associated with two programming loops. Namely, the second start voltage Vst2 can be selected from pulse voltages Vpgm_1~Vpgm_x which are differently established from each other in voltage level and programming loop occurrence. For example, if the second start voltage Vst2 of Vpgm_2 is selected as the program start voltage Vstart, a memory cell is programmed using a number of programming loops that is two less than a maximum number of programming loops. In this manner, the programming rate for the flash memory device is increased.

Figure 2:
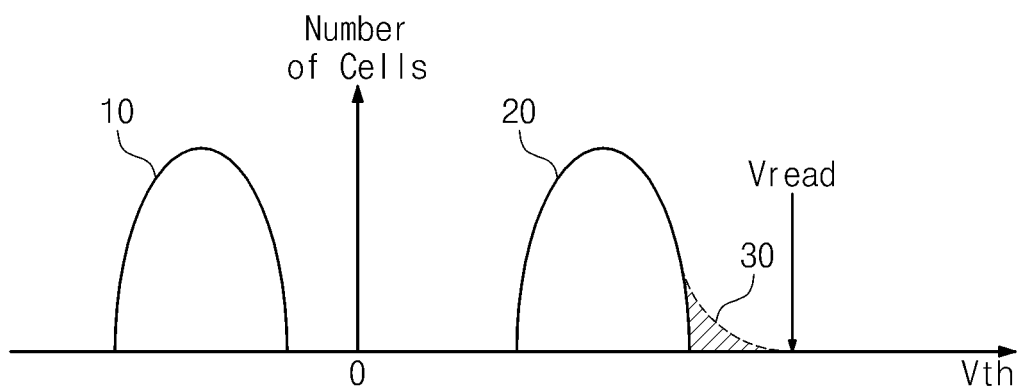
FIG. 2 is a graphic diagram showing a threshold voltage distribution for over-programmed memory cells.

FIG. 2 is a graphic diagram showing a threshold voltage distribution for over-programmed memory cells. Referring to FIG. 2, initial threshold voltages for memory cells are assumed to be in an erased state 10. According to the programmed results for stored data, the threshold voltages for the memory cells will exist in either an erased state 10 or a programmed state 20. During the programming operation, in order to hold threshold voltages in the erased state 10, memory cells belonging to the erased state 10 are inhibited from being programming (i.e., a program-inhibited operation is performed). However, memory cells changing their threshold voltage to correspond to the programmed state 20 are programmed using an ISPP mode beginning with either the first start voltage Vst1 or the second start voltage Vst2. If memory cells are programmed beginning with the second start voltage Vst2, it is able to accelerate the programming rate. But, if there are memory cells faster (i.e., more readily programmed) than other memory cells, the programmed voltage distribution for such memory cells may be changed beyond its intended range (i.e., the programmed voltage may extend upward). This result is referred to as 'over-programming' or the 'over-programmed effect'. A region 30 associated with over-programmed memory cells is shown in FIG. 2.

Troubles caused by over-programming are particularly apparent during a subsequent read operation. During the read operation, a read voltage is applied to unselected word lines while 0V is applied to a selected word line. Here, there are insufficiently conductive memory cells among the over-programmed memory cells associated with the unselected word lines. In this situation, a selected memory cell, which is an ON-cell, would be erroneously sensed as an OFF-cell. The frequent occurrence of such malfunctions during cell state detection may significantly impair the reliability of the flash memory device.

Figure 3:
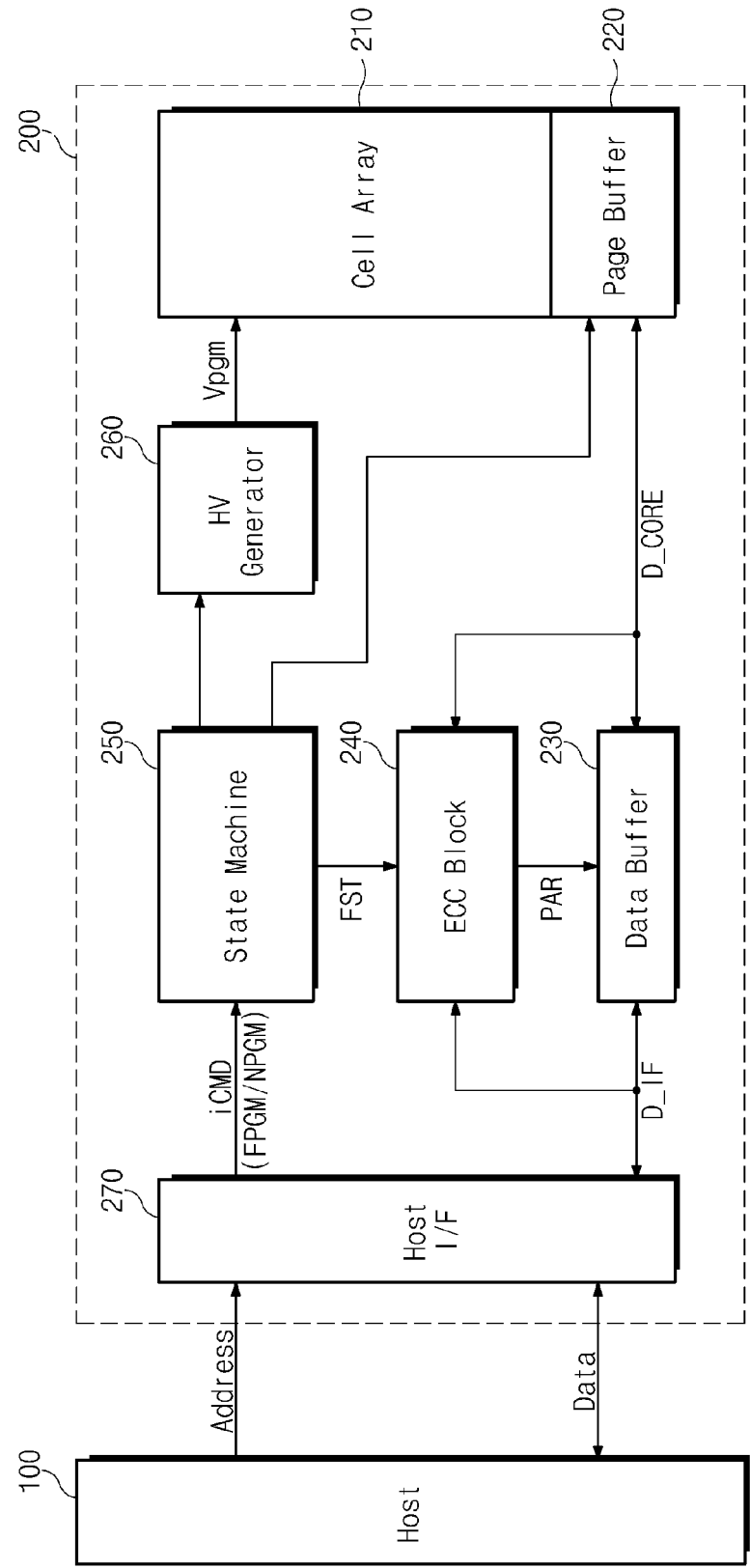
FIG. 3 is a block diagram illustrating a functional structure of a memory system in accordance with an embodiment of the invention.

FIG. 3 is a block diagram illustrating a memory system 200 suitable for a high-frequency (or fast) programming operations in accordance with an embodiment of the invention. Referring to FIG. 3, memory system 200 is configured to store received data in response to a command from a host 100, and is further configured to provide read data requested by host 100. Host 100 transfers distinct programming command indicating whether a fast or a normal programming operation should be performed by memory system 200. Memory system 200 receives the programming command from host 100 and programs received data into memory cells contained within cell array 210 using an ISSP programming mode that begins with a program pulse set at the first start voltage Vst1 or the second start voltage Vst2.

When there is a need to write data into memory system 200, host 100 determines a programming mode (fast or normal) with reference to an indicated priority for the program data. In this context, "priority" may be determined in relation to a number of different variables related to data type, data use characteristics, reliability requirements, etc. If the program data must be significantly reliable, host 100 selects and communicates a normal programming command to memory system 200, and the corresponding programming operation begins operation at the first start voltage Vst1. In this case, a host interface 270 transfers an internal normal programming command (NPGM) to a state machine 250 in order to operate memory system 200 in the normal programming mode. Otherwise, if the priority of the program data is associated with fast programming, host 100 provides a fast programming command and the corresponding programming operation begins operation at the second start voltage Vst2. In this case, the host interface 270 transfers an internal fast programming command (FPGM) to state machine 250 in order to operate memory system 200 in the fast programming mode. (In similar fashion, if a read command were indicated an internal fast read command or an internal normal read command would be transferred from host interface 270 to state machine 250).

In response to the different programming commands (NPGM and FPGM) received from host 100, memory system 200 operates to program data using program start voltages that are different from each other. During the fast and normal programming modes, error correction functions are also different from each other and are activated in relation to the different (fast/normal) programming modes.

Memory cell array 210 is formed by configured pluralities of flash memory cells, either single bit or multi-bit in their operating nature. In cell array 210, the individual flash memory cells are not physically differentiated by the fast and slow programming modes. Namely, the same memory cell may be programmed using fast or normal programming modes.

A page buffer 220 functions as a writing driver or sense amplifier in accordance with a selected operating mode (program or read). During a programming operation, page buffer 220 receives program data from a data buffer 230. Page buffer 220 then writes the program data to memory cells in memory cell array 210 via associated word lines and bit lines, as is conventionally understood. During a read operation, page buffer 220 operates to sense and latch data stored in selected memory cells of memory cell array 210, again as is conventionally understood.

Data buffer 230 temporarily stores program data received by memory system 200 and/or read data to be exported by memory system 200. During a programming operation, data buffer 230 provides page buffer 220 with program data and error codes generated from the program data. During a read operation, error data associated with the read data is provisionally stored in data buffer 230 and may be used to repair the read data by, for example, merging with an error code PAR provided from an error check and correction (ECC) block 240.

ECC block 240 detects and corrects an error in the program data or the read data in response to a fast mode signal FST provided by state machine 250. In the illustrated embodiment, ECC block 240 is operable in two (2) distinct ECC modes; namely, ECC block 240 is able to operate in a single-bit ECC mode capable of repairing a 1-bit error and a multi-bit ECC mode capable of repairing a multi-bit error more than 2 bits. If the fast mode signal FST is active, ECC block 240 operates in the multi-bit ECC mode during the corresponding programming or read operation. In contrast, if the fast mode signal FST is inactive, ECC block 240 operates in the single-bit ECC mode during the corresponding programming or read operation.

State machine 250 controls the overall sequence of execution steps associated with the programming, read, and erase operations in response to an internal operation command iCMD provided by host interface 270 in response to an external command received from host 100. Especially, during the programming operation, state machine 250 controls a high voltage generator 260 and page buffer 220 in response to the fast mode signal FST. During the programming operation, if the fast mode signal FST is active, state machine 250 enables high voltage generator 260 to generate an ISPP program voltage Vpgm that begins from the second start voltage Vst2. State machine 250 also controls page buffer 220 to write program data to memory cells synchronously with the ISPP program voltage Vpgm. During the read operation, state machine 250 enables high voltage generator 260 and page buffer 220 to properly bias word lines associated with memory cells indicated by a read command from host 100, as well as precharging and sensing associated bit lines.

High voltage generator 260 provides memory cell array 210 with high voltages corresponding to a current operation (programming, erase, read) under the control of state machine 240. When memory system 200 is operating in the fast programming mode, the fast mode signal FST is active and high voltage generator 260 generates the ISPP program voltage Vpgm beginning with the second start voltage Vst2. On the other hand, when memory system 200 is operating in the normal programming mode, the fast mode signal FST is inactive and high voltage generator 260 generates the ISPP program voltage Vpgm beginning with the first start voltage Vst1. In either case, the ISPP program voltage Vpgm is applied to a selected word line of memory cell array 210 associated with memory cells indicated by the programming, read, or erase command.

Host interface 270 intermediates the flow of data between host 100 and memory system 200. In particular, host interface 270 provides one of the internal fast/normal programming/ read commands FPGM and MPGM to state machine 250 in response to commands received from host 100.

With the aforementioned architecture of memory system 200 in mind as an example, embodiments of the invention are able to reduce data errors conventionally caused by over-programming during a fast programming mode. The role of ECC block 240 within certain embodiments of the invention is an important one in this regard.

Figure 4:
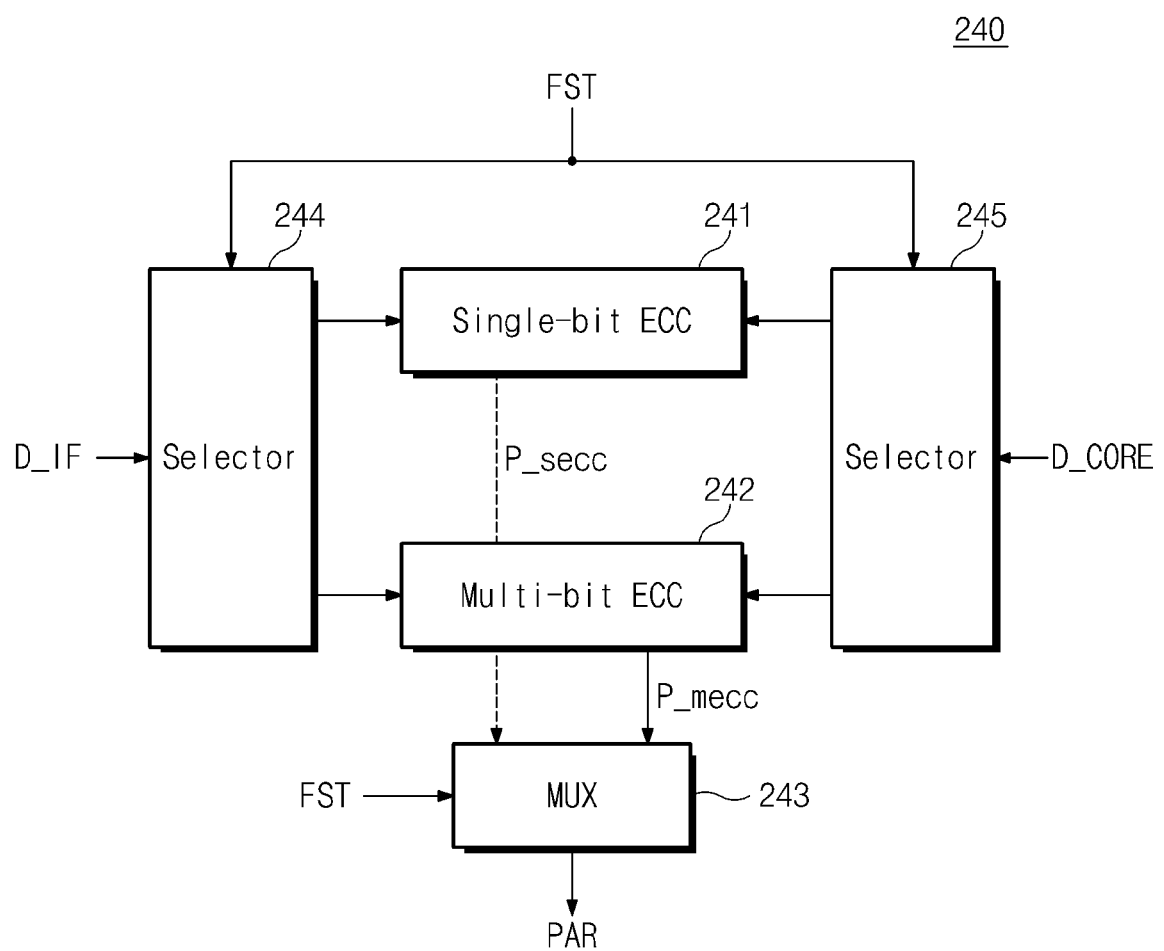
FIG. 4 is a block diagram illustrating a functional structure of the ECC block shown in FIG. 3.

FIG. 4 is a block diagram illustrating an exemplary functional structure of ECC block 240 shown in FIG. 3. Referring to FIG. 4, ECC block 240 includes a single-bit ECC engine 241 and a multi-bit ECC engine 242. Single-bit and multi-bit ECC engines 241 and 242 are alternatively selected in accordance with the active/inactive state of the fast mode signal FST.

During a programming operation, ECC block 240 operates as follows. If the fast mode signal FST is inactive, a program selector 244 transfers program data D_IF to single-bit ECC engine 241 from host interface 270. Single-bit ECC engine 241 generates a single bit parity code P_secc which is used to detect and correct a single-bit error in program data D_IF. In the illustrated embodiment, the single bit parity code P_secc is transferred to a multiplexer (MUX) 243, and multiplexer 243 transfers the single bit parity code P_secc to data buffer 230. In the illustrated examples, parity bit data is used to illustrate a broad range of possible error detection and/or correction data.

However, if the fast mode signal FST is active, program selector 244 transfers the program data D_IF to multi-bit ECC engine 242 from host interface 270. Multi-bit ECC engine 242 generates a multi-bit parity code P_mecc which is used to detect and correct a multi-bit error in program data D_IF. The multi-bit parity code P_mecc is transferred to multiplexer (MUX) 243, and multiplexer 243 then transfers the multi-bit parity code P_mecc to data buffer 230. The program data and the corresponding parity code (or error code) are collectively programmed to memory cells in memory cell array 210 according to an indicated programming mode.

During a read operation, ECC block 240 operates as follows. If the fast mode signal FST is inactive, a read selector 245 transfers read data D_CORE to single-bit ECC engine 241 from page buffer 220. Single-bit ECC engine 241 obtains single bit parity code P_secc from the read data D_CORE and detects/corrects a single bit error in the read data D_CORE. The single bit parity code P_secc may also be transferred to multiplexer (MUX) 243, and from multiplexer 243 to data buffer 230 for export with the read data D_CORE.

However, if the fast mode signal FST is active, read selector 245 transfers the read data D_CORE to multi-bit ECC engine 242 from page buffer 220. Multi-bit ECC engine 242 obtains multi-bit parity code P_mecc and uses the multi-bit parity code P_mecc to detect/correct a multi-bit error in the read data D_CORE. Multi-bit ECC engine 242 may also generates the multi-bit parity code P_mecc and transfer it to multiplexer 243 and then to data buffer 230 for export with the read data D_CORE. In one embodiment of the invention, the detected error may be repaired by merging the read data with the corresponding parity code P_mecc (or P_secc) in data buffer 230.

As described above, either the single-bit ECC engine 214 or multi-bit ECC engines 242 is alternatively selected in response to the activation state of the fast mode signal FST. Namely, during the fast programming mode, multi-bit ECC engine 242 is selected, and during normal programming mode, single-bit ECC engine 241 is selected. This operative selection enables memory system 200 to sufficiently address an error in program or read data that may have been caused by the over-programmed effect during the fast programming mode. In other words, a more robust ECC functionality is provided in relation to the fast programming mode recognizing the increased likelihood of data errors caused by over-programming.

Figure 5:
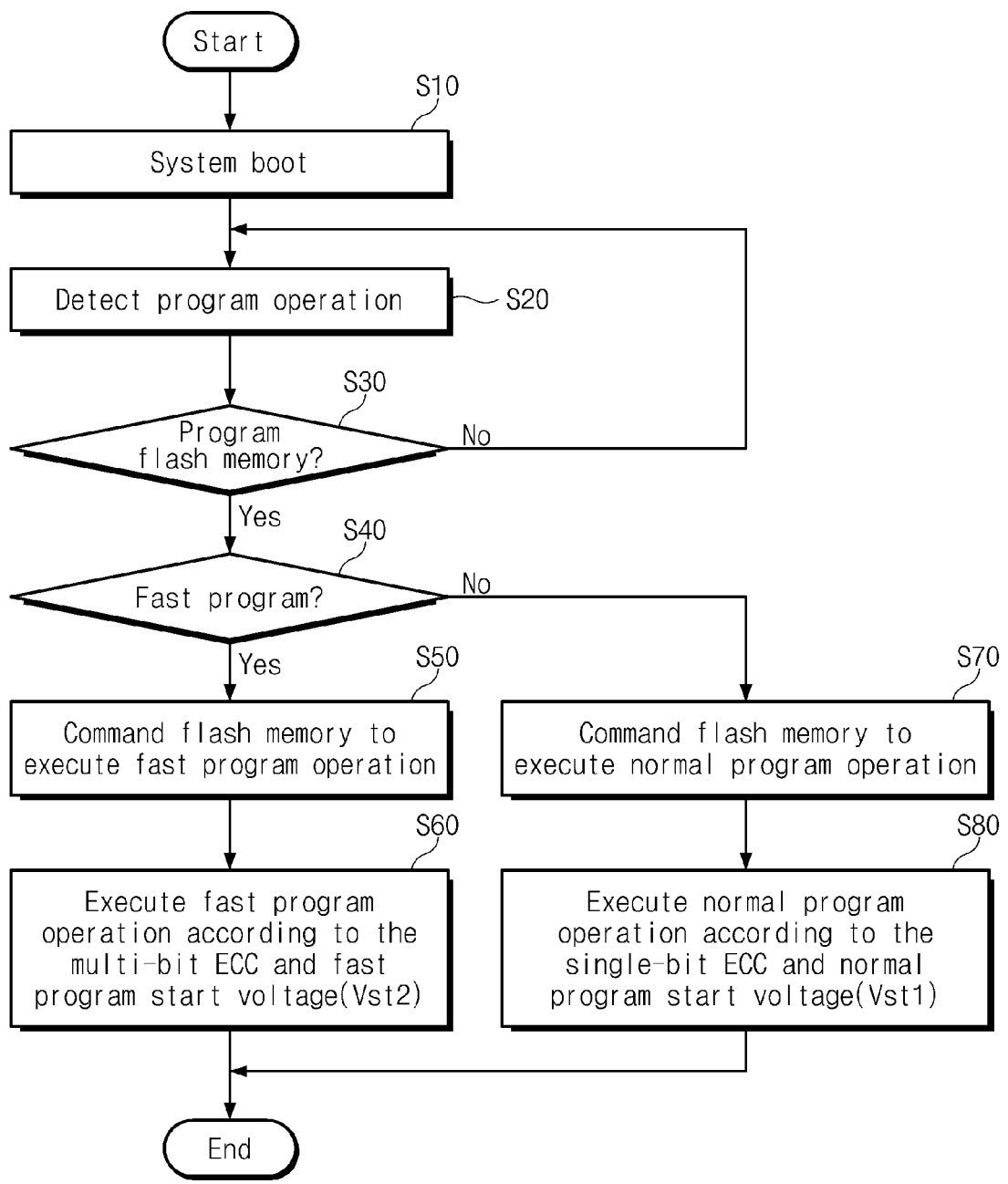
FIG. 5 is a flow chart summarizing an exemplary programming method for the memory system shown in FIG. 3.

FIG. 5 is a flow chart summarizing an exemplary programming method for the memory system shown in FIG. 3. Referring to FIG. 5, the fast or normal programming modes are alternatively selected in accordance with a command received from host 100. A determination regarding fast or normal programming mode may be made using software such as an operating system (OS) or application program resident in host 100.

As shown in FIG. 5, first, responding to power supply, a system booting step is carried out by initiating operation of host 100 and memory system 200 (S10). After completing system boot, host 100 interrogates a cache or queue of requested operations, which may include a command indicating a program operation directed to data to be stored in memory system 200 (S20). Once a command implicating a program operation is identified (S30=yes), host 100 determines whether or not a fast programming mode is appropriate (S40). Upon determining that a fast programming mode is called for (S40=yes), memory system 200 is commanded and controlled to execute a fast programming operation as described above (S50). Memory system 200 then activates multi-bit ECC engine 242 to generate multi-bit parity code P_mecc from the program data provided with the fast programming command, and the multi-bit parity code P_mecc and the program data are programmed to memory cells in memory cell array 210 using an ISPP program voltage Vpgm that begins with the second start voltage Vst2 (S60).

However, upon determining that a normal programming mode is called for (S40=no), memory system 200 is commanded and controlled to execute a normal programming operation as described above (S70). Memory system 200 activates single-bit ECC engine 241 to generate the single bit parity code P_secc from the program data. The single bit parity code P_secc and the program data are collectively programmed to memory cells in memory cell array 210 using an ISPP program voltage Vpgm that begins with the first start voltage Vst1 (S80).

According to the foregoing method, a current program start voltage and a current error correction scheme for memory system 200 are dependent upon a host 100 determination regarding the alternate use of a fast programming mode verses a normal programming mode. Thus, the complete system enjoys a programming flexibility (i.e., the potential use of a fact programming mode) without the attendant impairment to data integrity that characterizes conventional uses of a fast programming mode to increase the programming rate of the memory system.

Figure 6:
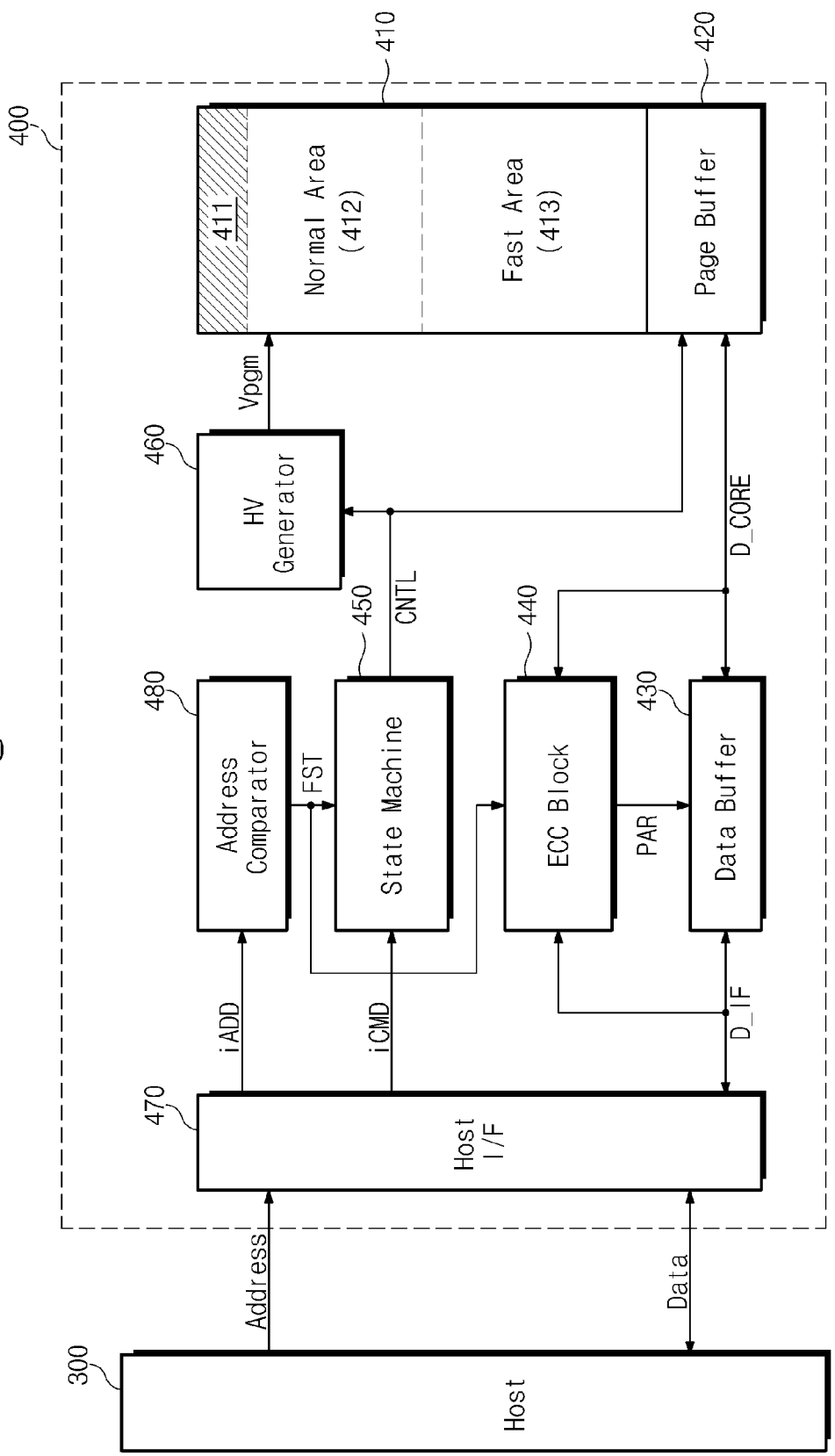
FIG. 6 is a block diagram illustrating a functional structure of a memory system in accordance with another embodiment of the invention.

FIG. 6 is a block diagram illustrating a functional structure of a memory system 400 in accordance with another embodiment of the invention. In this embodiment, memory cell array 410 is divided into a fast area 413 and a normal area 412. Memory cell array 410 also comprises an address area 411 storing address information defining the normal and fast areas 412 and 413 (e.g., providing address indexing to the respective data storage areas). For example, the address information may define a range of row addresses corresponding to fast area 413 and/or normal area 412. The address information is provided to an address comparator 480 and a host 300 during system boot.

In one example address comparator 480 determines whether an input address received from host 300 as part of a program command corresponds to fast area 413 or normal area 412 by referencing the address information stored in address area 411. Where the received address associated with the program command corresponds to an address in fast mode 413, address comparator 480 generates the fast mode signal FST and applies the fast mode signal FST to a state machine 450 and an ECC block 440. State machine 450 and ECC block 440 operate to program the data to memory cells in fast area 413 using an ISPP method beginning at the second start voltage Vst2 and a corresponding multi-bit ECC engine.

A page buffer 420, a data buffer 430, ECC block 440, and a high voltage generator 460 have essentially the same configuration and operation as explained above in relation to analogous elements in FIG. 4. Thus, the operation of page buffer 420, data buffer 430, ECC block 440, and high voltage generator 460 will not be further described.

As memory cell array 410 is divided into normal and fast areas 412 and 413, during a programming operation, the memory cells included in normal area 412 will be programmed using a relatively lower program start voltage, (i.e., the first start voltage Vst1). Whereas, memory cells included in fast area 413 will be programmed using a relatively higher program start voltage, (i.e., the second start voltage Vst2). As before, the higher program start voltage has the beneficial effect of increasing the programming rate of the memory devices in memory system 400.

In one embodiment of the invention, memory cell array 410 is divided into normal and fast areas 412 and 413 according to a partitioning of row addresses. The address information stored in address area 411 is deemed to have a high priority and as such will typically be included in normal area 412. Additional initialization information may also be stored in address area 411, such as one-time programmable (OTP) data, boot code, etc. The address information along with any additional initialization information stored in address area 411 may be retrieved and provided to address comparator 480 during a system boot (or power-up).

Address comparator 480 stores and retains the address (and optionally initialization) information read from address area 411 during the boot operation. Address comparator 480 operates by comparing the address information with an internal address iADD provided by a host interface 470 in relation to a command received from host 300. If the internal address iADD corresponds with an address associated with fast area 413, address comparator 480 activates the fast mode signal FST. The fast mode signal FST is then applied to state machine 450 and ECC block 440.

State machine 450 controls the overall sequence of instructions and related control signals necessary to effect programming, read, and erase operations requested by commands received from host 300 and defining the nature of the internal command iCMD provided by host interface 470. In particular, during a programming operation, state machine 450 controls high voltage generator 460 and page buffer 420 in relation to the state of fast mode signal FST. During the programming operation, if the fast mode signal FST is active, state machine 450 enables high voltage generator 460 to generate an ISPP program voltage Vpgm beginning at the second start voltage Vst2. State machine 460 also controls page buffer 420 to program data to memory cells synchronously with the program voltage Vpgm. During a read operation, state machine 450 enables high voltage generator 460 and page buffer 420 to conduct operations for biasing word lines of memory cells, precharging bit lines, and sensing data from the memory cells.

Host interface 470 controls the flow of data between host 300 and memory system 400. Host 300 provides commands and associated program data to memory system 400, or receives read data from memory system 400. To program data to memory cells in fast area 413 of memory system 400, host 300 is able to control memory system 400 by means of a data address. Accordingly, during a boot operation, host 300 may store the address information into a working memory (e.g., a R/W scratch pad memory) using initialization information stored in address area 411 of memory system 400.

With the aforementioned structure, a flash memory system according to an embodiment of the invention is able to detect and correct data errors which may be caused by over-programming suing the fast programming mode. This capability may be flexibly provided by means of an ECC block incorporating both single by and multi-bit ECC capabilities. During a read operation, if memory cells associated with fast area 413 are identified by the corresponding read command, the multi-bit ECC engine is selected to detect and correct an error in the read data.

Figure 7:
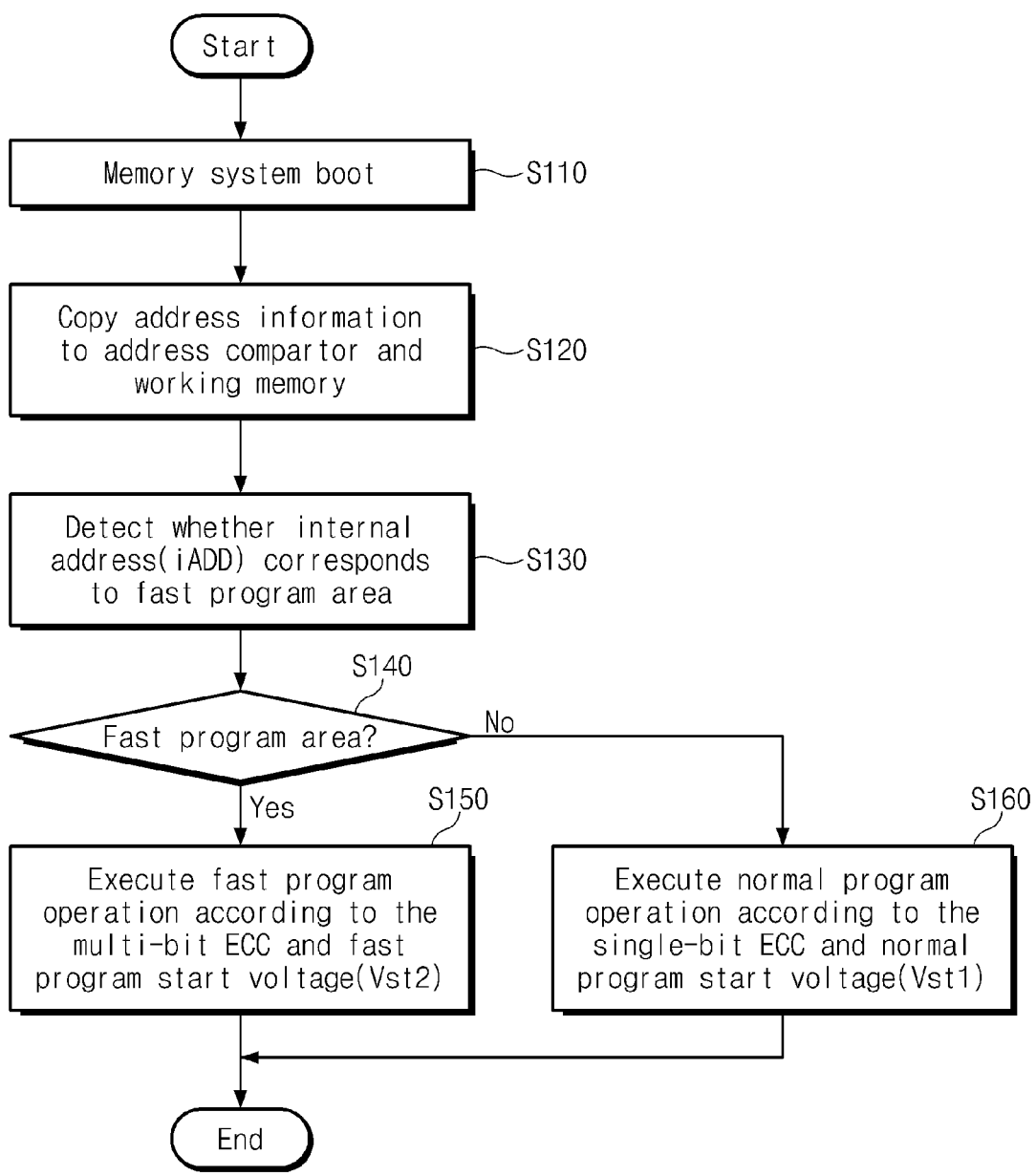
FIG. 7 is a flow chart summarizing a programming method for the memory system shown in FIG. 6.

FIG. 7 is a flow chart summarizing an exemplary programming method for the memory system shown in FIG. 6. During a programming operation, either the fast programming mode or the normal programming mode is selected with reference to an address provided from host 300. Initially, however, host 300 must be able to determine whether program data is associated with fast area 413 or normal area 412 in relation to its relative priority, as has been discussed above. Host 300 then communicates a program command with corresponding address and program data to memory system 400. Memory system 400 will then program the data to memory cells in either fast area 413 or normal area 412 with reference to its address.

That is, upon power up, memory system 400 is booted (S110). Host 300 then issues one or more commands copying the address information stored in address area 411 (and optionally initialization information) to address comparator 480 and a working memory within host 300 (S120). Upon subsequently receiving a program command from host 300 indicating a programming operation, address comparator 480 determines whether a corresponding internal address iADD provided by host interface 470 corresponds to an address associated with fast area 413 (S130). If the internal address iADD corresponds to an address in fast area 413, address comparator 480 generates an active fast mode signal FST.

Upon determining that the internal address iADD corresponds to an address in fast area 413 (S140=yes and fast mode signal FST is active), state machine 450 controls the operation of a multi-bit ECC engine 242 (refer to FIG. 4) and high voltage generator 460. High voltage generator 460 generates an ISPP program voltage Vpgm beginning with the second start voltage Vst2. The program data is provided to the multi-bit ECC engine 242 as described above and the ISPP program voltage Vpgm is used to program the data to memory cells in fast area 413 (S150).

However, upon determining that the internal address iADD corresponds to an address in normal area 412 (S140=no and fast mode signal FST is inactive), state machine 450 controls the operation of a single bit ECC engine 241 (refer to FIG. 4) and high voltage generator 460. High voltage generator 460 generates an ISPP program voltage Vpgm beginning with the first start voltage Vst1. The program data is provided to the single bit ECC engine 241 as described above and the ISPP program voltage Vpgm is used to program the data to memory cells in normal area 412 (S160).

Figure 8:
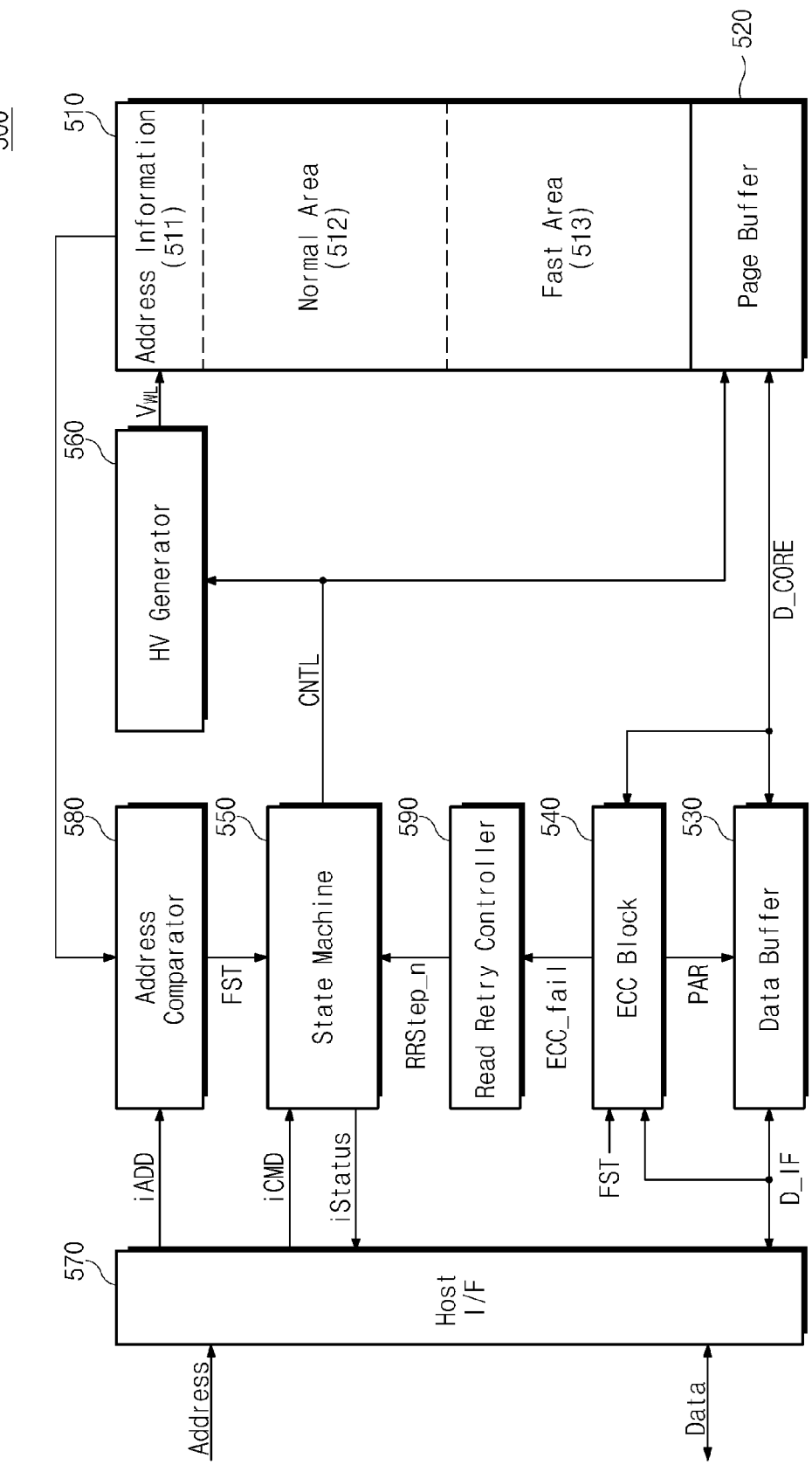
FIG. 8 is a block diagram illustrating a functional structure of a memory system in accordance with another embodiment of the invention.

FIG. 8 is a block diagram illustrating a functional structure of a memory system 500 in accordance with another embodiment of the invention. This embodiment emphasizes the capability to read data from either fast or normal areas in a memory cell array. Referring to FIG. 8, memory system 500 reads data from a memory cell array 510 in response to a read command received from a host. Of note, even where a read data error is greater than the capabilities of ECC block 540 (i.e., a data error out of a defined correctable range for ECC block 540), memory system 500 may yet be able to correct the error bits in the read data.

Memory cell array 510, a page buffer 520, a data buffer 530, an address comparator 580, and a host interface 570 have a similar configuration and operation as analogous elements described in relation to the embodiment shown in FIG. 6. However, memory system 500 further comprises a read retry controller 590.

If a read command indicates read data stored in fast area 513, memory system 500 enables multi-bit ECC engine 242 (refer to FIG. 4) and reads the data from fast area 513 using the provided address. Read data sensed during the read operation is latched in page buffer 520. The read data is then transferred to ECC block 540 from page buffer 520. ECC block 540 detects errors in the read data. If the number of errant bits in the read data detected by multi-bit ECC engine 242 is larger than the number of bits that may be corrected by multi-bit ECC engine 242, then ECC block 540 communicates a correction fail signal ECC_fail to read retry controller 590.

Read retry controller 590 transfers an incrementing read-retry signal RRStep_0 to n to state machine 550 in response to the correction fail signal ECC_fail, and the current read operation is resumed at the same page. State machine 550 rereads the read data from the indicated (and read failed) page using an increased bit-line sensing time in response to a first read-retry signal RRStep_1. If following the first read retry operation, the number of errant bits in reread page data still exceeds the error correction capacities of ECC block 540, then ECC block 540 again generates the correction fail signal ECC_fail which is applied to read retry controller 590 which in turn generates a second read-retry signal RRStep_2. Responding to the second read-retry signal RRStep_2, state machine 550 controls high voltage generator 560 to generate a read voltage Vread capable of compensating an threshold voltage increment for over-programmed memory cells. If following this second read retry operation using an enhanced read voltage, the number of errant bits included in read data falls within the error correction capacities of ECC block 540, the errant bits are corrected without generating another correction fail signal ECC_fail.

In reading data from fast area 513 using the aforementioned approach, memory system 500 is able execute multiple read retry operations having (1) a varying the sensing time, and (2) an enhanced read voltage Vread.

Figure 9:
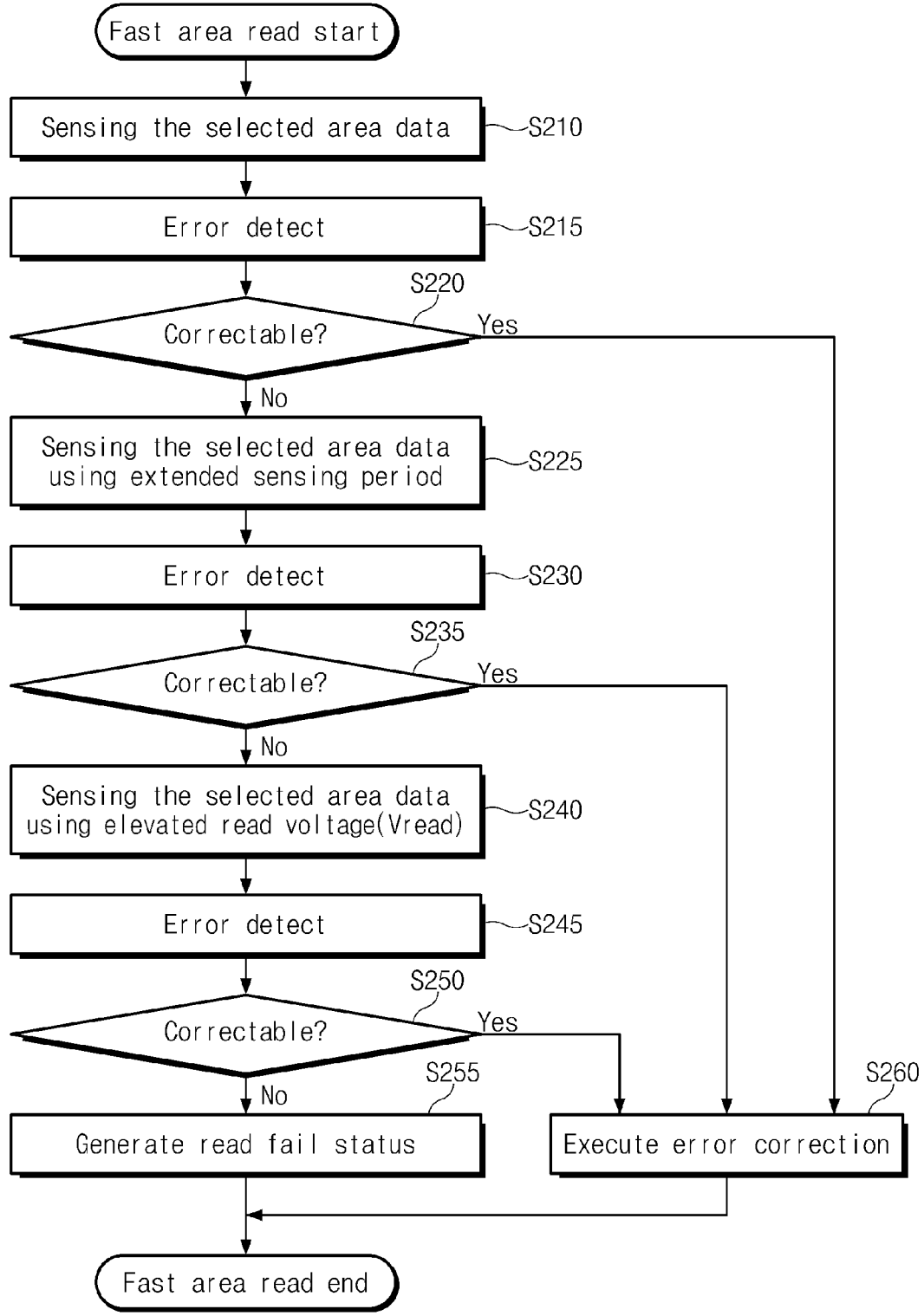
FIG. 9 is a flow chart summarizing a reading method for the memory system shown in FIG. 8.

FIG. 9 is a flow chart summarizing read method, including a read retry functionality, for in the memory system 500 shown in FIG. 8. Referring to FIG. 9, the read retry operation are performed by first increasing the read data sensing time and then enhancing (increasing) the level of an applied read voltage Vread within memory system 500.

At the beginning of the read operation, state machine 550 controls page buffer 520 and high voltage generator 560 to sense, amplify, and provide data of a selected page to ECC block 540 (S210). ECC block 540 accepting the read data from the selected page detects error bits in the read data (S215). ECC block 540 then determines whether the detected number of error bits falls within a predetermined range associated with the error correction capacities of ECC block 540 (S220). If the detected number of error bits falls within the correctable range of ECC block 540 (e.g., a constituent multi-bit ECC engine 242), then ECC block 540 executes an error correction operation to repair the error bits in the read data. (S260).

However, if the number detected error bits falls outside of its correctable range, ECC block 540 generates the correction fail signal ECC_fail and the illustrated method executes a first read retry operation (S225). That is, when the first correction fail signal ECC_fail is generated, read retry controller 590 generates the first read-retry signal RRStep_1 and communicates it to state machine 550. State machine 550 then controls execution of the first read retry operation wherein an increased read data sensing time is applied to the reading of the indicated data stored in memory cell array 510. The first reread page data is obtained and transferred to ECC block 540 and error bits are again detected in relation to the first reread page data (S230). If ECC block 540 determines that the detected number of error bits falls within the correctable range (S235=yes), then the detected error bits of the first reread page data are corrected by ECC block 540 during an applied error correction operation (S260). However, if number of error bits yet falls outside of the correctable range of ECC block 540 (S235=no), then ECC block 540 communicates a second correction fail signal ECC_fail to read retry controller 590, and read retry controller 590 provides a corresponding second read-retry signal RRStep_2 to state machine 550. In response, state machine 550 enables high voltage generator 560 and page buffer 520 to execute a second read retry operation using an enhanced read voltage Vread in response to the second read-retry signal RRStep_2 (S240). The resulting second reread page data is latched by page buffer 530 and transferred to ECC block 540 where ECC block 540 again detects bits in the second reread page data reread data (S245). If, thereafter, ECC block 540 determines that the detected error bits in the second reread page data falls within the correctable range (S250=yes), then the error bits are corrected (S260). However, if the number of error bits is beyond the error correction capacities of ECC block 540, ECC block 540 determines a read fail within memory system 500 and generates a corresponding read fail message (S255).

According to the aforementioned read operation, embodiments of the invention are able to read data using a relatively high program start voltage in relation to (potentially, and as needed) an increased sensing time and an enhanced read voltage using the fixed error correction capabilities of ECC block 540.

Figure 10:
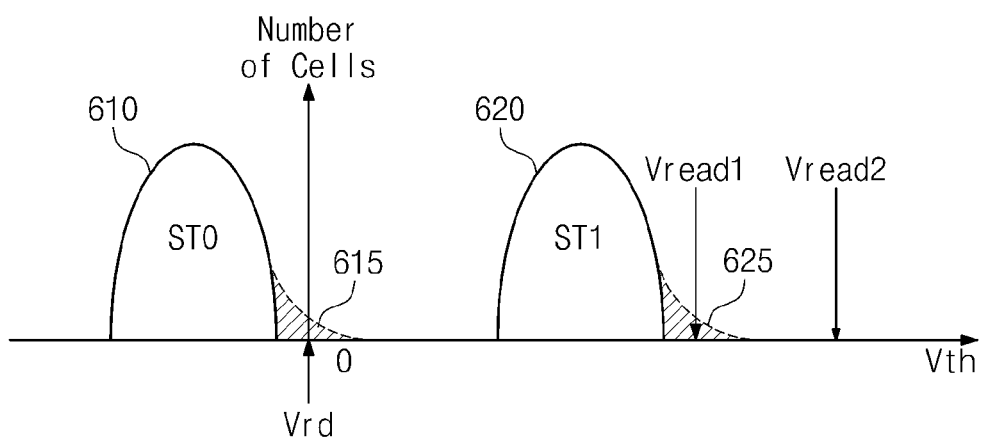
FIG. 10 is a graphic diagram showing the effect of voltage stress induced from a read voltage.

FIG. 10 is a graphic diagram showing the effect of voltage stress induced by a read voltage, and further schematically depicting threshold voltage distributions for memory cells in particular memory cell array regions which are frequently accessed during read operations, such as those memory cells storing address information and OTP related data. Referring to FIG. 10, a frequent read region storing initialization information such as boot code or OTP data is repeatedly read during memory system boot operations following a first programming operation. Consistent with this type of data, the frequent read regions are not subsequently (or very rarely) programmed following their first programming operation. Thus, memory cells within the frequent read regions are repeatedly exposed to the read voltage Vread applied to unselective word lines (hereafter, "the unselective read voltage Vread") during multiple read operations.

In general, the unselective read voltage Vread should be considered in relation to a distribution region 625 into which a threshold voltage state 620 is extending due to over-programming. In other words, in order to interrupt an over-programmed effect that is proportional to the number of program and erase operations, the unselective read voltage Vread should be established with a proper margin. Namely, in one embodiment of the invention, the unselective read voltage is set to an elevated read voltage Vread2 shown in FIG. 10. But, if the elevated read voltage Vread2 is repeatedly applied to the frequent read regions of a memory cell array by repetitive read operations, then the memory cells in the frequent read region may be softly programmed. For that reason, errors may arise during read operations influenced by this effect, such that memory cells having a threshold voltage corresponding to an erased state 610 are weakly programmed by the elevated read voltage Vread2 being repeatedly applied to unselective word lines. This phenomenon is generally referred to as 'soft-programming' or 'the soft-programmed effect'. The soft-programmed effect causes the threshold voltages of memory cells intended to be programmed in the erased state 610 to slightly increase in accordance with this effect (i.e., the memory cells assume an extended voltage distribution 615). Such memory cells 615 may include memory cells that have been programmed to threshold voltages greater than 0V. In this case, a bit error occurs while reading data by applying 0V to a word line coupled to soft-programmed memory cells.

Certain embodiments of the invention provide a read method capable of reducing error bits by minimizing generation of the soft-programming effect while reading data from frequent read regions of a memory cell array. Namely, "frequently read data" from such regions, the voltage applied to the unselective read voltage is set to a reduced unselective read voltage Vread1 below the elevated read voltage Vread2. From the results of a read operation performed under these conditions, if an error bit arises, a read retry operation may be performed using an extended bit-line sensing time under the same word line voltage conditions. According to this extended sensing time read operation, minimum voltage stress is imparted to memory cells storing frequently read data. As a result, the number of read cycles applied to memory cells storing frequently read data is markedly increased.

Figure 11:
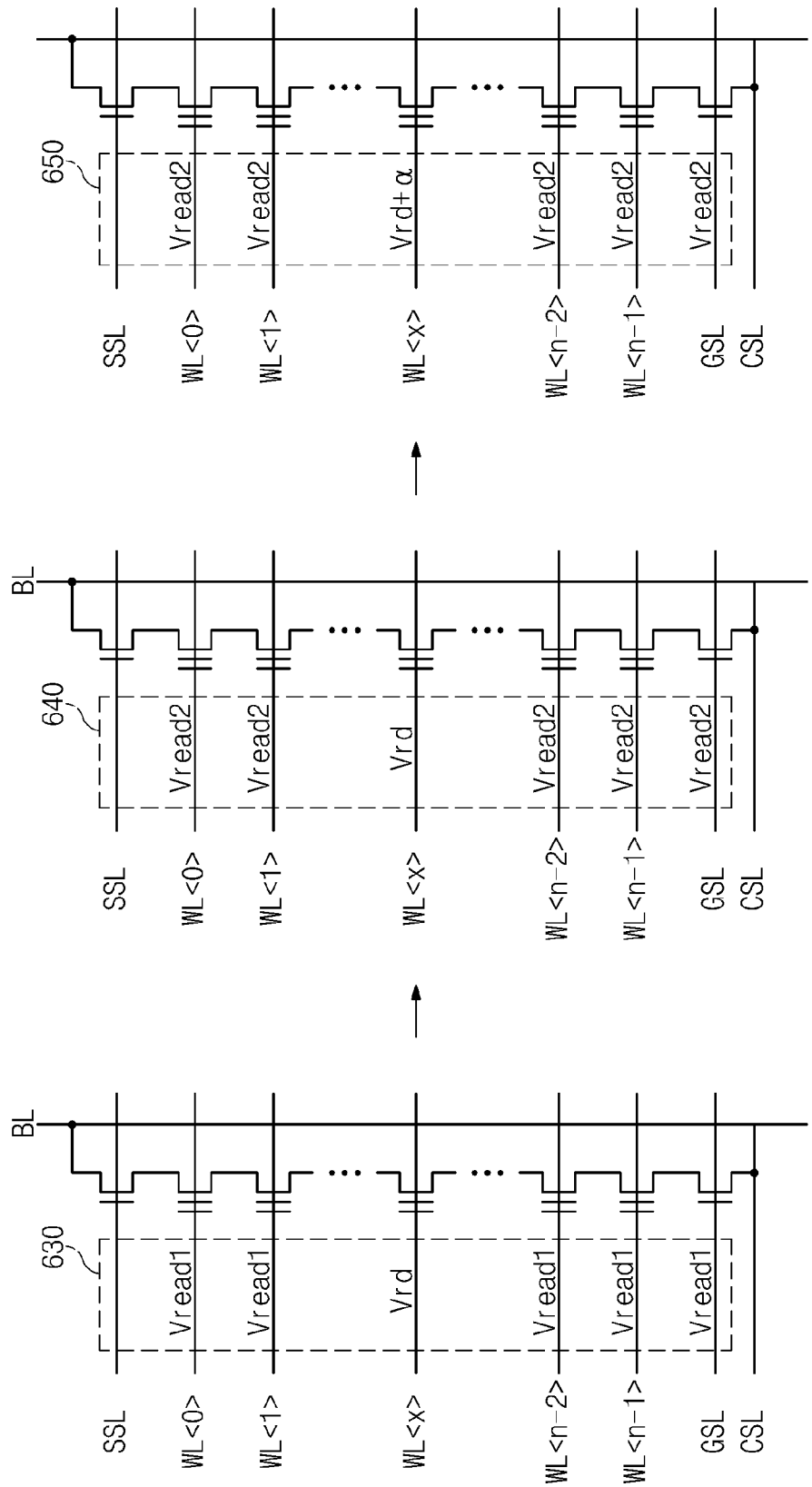
FIG. 11 is a circuit diagram further illustrating a reading method for memory cells in accordance with an embodiment of the invention.

FIG. 11 is a circuit diagram illustrating a feature of a read operation applied to memory cells in accordance with an embodiment of the invention. FIG. 11 schematically illustrates how to read data from the frequently read memory cells or memory blocks using a reduced unselective read voltage Vread1 and an elevated unselective read voltage Vread2 of FIG. 10. Referring to FIG. 11, a first word-line voltage group 630 is applied to word lines during a first read operation to a selected block. A selective read voltage Vrd is applied to a selected word line WL<x> of the selected block, while the reduced unselective read voltage Vread1 is applied to unselected word lines. The reduced unselective read voltage Vread1 is lower than an elevated unselective read voltage Vread (e.g., 4.5V) that is provided to normal word lines. If there an error bit arises in resulting read data from first word-line voltage group 630, a first read retry operation using an extended bit-line sensing time is performed. After the first read retry operation, if one or more error bits persists, a second read retry operation is performed using the elevated unselective read voltage Vread2.

During the second read retry operation, the voltages applied to the word lines of the selected block are those shown in relation to a second word-line voltage group 640. If one or more error bits in the second reread page data yet persists following the conditions of second word-line voltage group 640, a third read retry operation is performed using the voltage conditions shown in relation to a third word-line voltage group 650.

In the third word-line voltage group 650, an elevated voltage level is adjusted upward from a normal selective read voltage Vrd applied to the selected word line. Namely, an elevated selective read voltage is applied at a level of Vrd+α, wherein α>0. It is permissible to further conduct an ECC operation for read data in accordance each with the word-line groups 630, 640, and 650. From a result of error detection, if detected error bits fall outside the established correctable range, the memory system is able to conduct successive the read retry operations, as needed, by alter the nature of applied word line voltages. A read retry operation using an extended bit-line sensing time may be performed even between the read operations with the word-line biasing patterns shown in FIG. 10.

Figure 12:
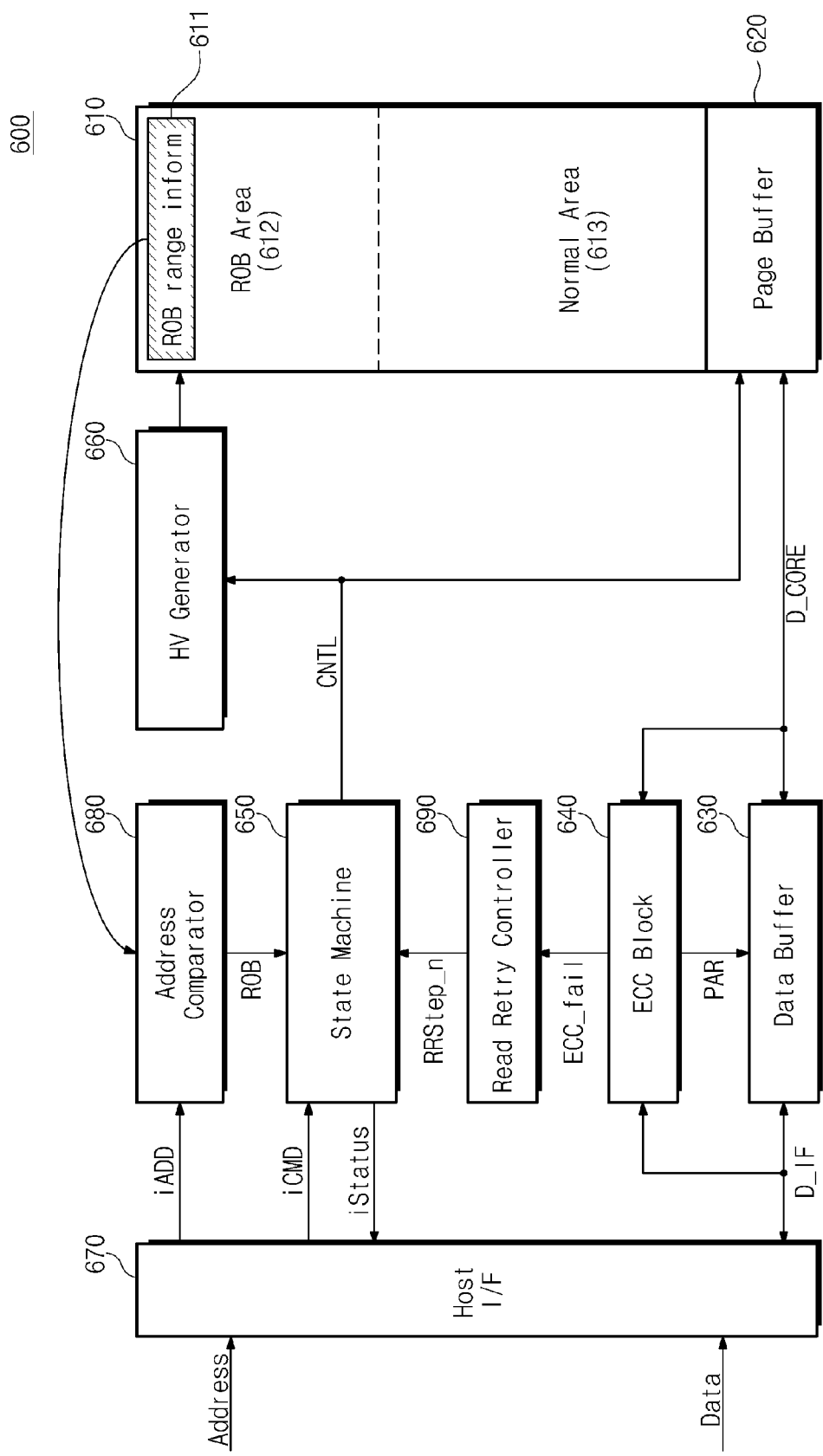
FIG. 12 is a block diagram illustrating a functional structure of a flash memory device able to reduce stress caused by a read voltage in accordance with an embodiment of the invention.

FIG. 12 is a block diagram illustrating the functional structure of a flash memory device able to reduce stress caused by an applied read voltage in accordance with an embodiment of the invention, wherein the read operation is performed in relation to a set of frequently read memory cells or a frequently read memory block in the manner described in relation to FIG. 11. Referring to FIG. 12, a state machine 650 repeats the read retry operation by varying word line voltages of a selected block if there is a read fail during the read operation directed to a frequently read memory block. A page buffer 620, a data buffer 630, an ECC block 640, a read retry controller 690, and a host interface 670 are configured and operate in a manner similar to that of analogous elements in FIG. 8. However, an address comparator 680 stores address information including frequent Read-Oriented-Block (ROB) information 611 stored as described above during system boot.

Thus, a memory cell array 610 includes a ROB area 612 and a normal area 613 that is programmable and erasable in a conventional sense. ROB area 612 is programmed with ROB range information. ROB area 612 is generally written with boot codes, OTP data, OS codes, and application codes. Such data in ROB area 612 may be accessed by the read operation unless there is an exception. If the unselective read voltage Vread is continuously applied to memory cells in high level, threshold voltages of the memory cells are raised to finally restrict the number of reading cycles.

During a read operation, address comparator 680 determines whether an input address iADD corresponds to address information stored in ROB area 612. If the input address iADD corresponds to ROB area 612 information, address comparator 680 activates and provides a ROB flag signal to state machine 650. State machine 650 controls high voltage generator 660 and page buffer 620 to read page data by means of the reduced unselective read voltage Vread1 during a first read operation. During this operation, read data is transferred to ECC block 640 through page buffer 620, and ECC block 640 detects error bits in the read data. Here, ECC block 640 may be configured to perform only an error detection function, or an error detection and error correction function.

ECC block 640 provides read retry controller 690 with a first correction fail signal ECC_fail indicating one or more error bits or an error bit which cannot be repaired. Read retry controller 690 outputs the first read-retry signal RRStep_1 to state machine 650 with reference to the first correction fail signal ECC_fail. Responding to the first read-retry signal RRStep_1, state machine 650 enables high voltage generator 660 and page buffer 620 to conduct a first read retry operation using an extended bit-line sensing time. If the correction fail signal ECC_fail is again generated, read retry controller 690 outputs a second read-retry signal RRStep_2. Responding to the second read-retry signal RRStep_2, state machine 650 enables high voltage generator 660 and page buffer 620 to read the same page using the elevated unselective read voltage Vread2. If the correction fail signal ECC_fail is yet again generated, read retry controller 690 provides a third read-retry signal RRStep_3 to state machine 650. Responding to the third read-retry signal RRStep_3, state machine 650 controls high voltage generator 660 and page buffer 620 to read the same page using the elevated unselective read voltage Vread2 and an elevated selective read voltage (Vrd+α).

As aforementioned, by using a reduced unselective read voltage Vread1 during the first read operation, the memory system is able to much reduce read voltage related stress, which is particularly acute in relation to memory cells associated portions of memory cell array 510 indicated within ROB area 612. This approach allows a selective increase in the maximum number of read operations, including read retry operations directed to memory cells identified within ROB block 612.

Figure 13:
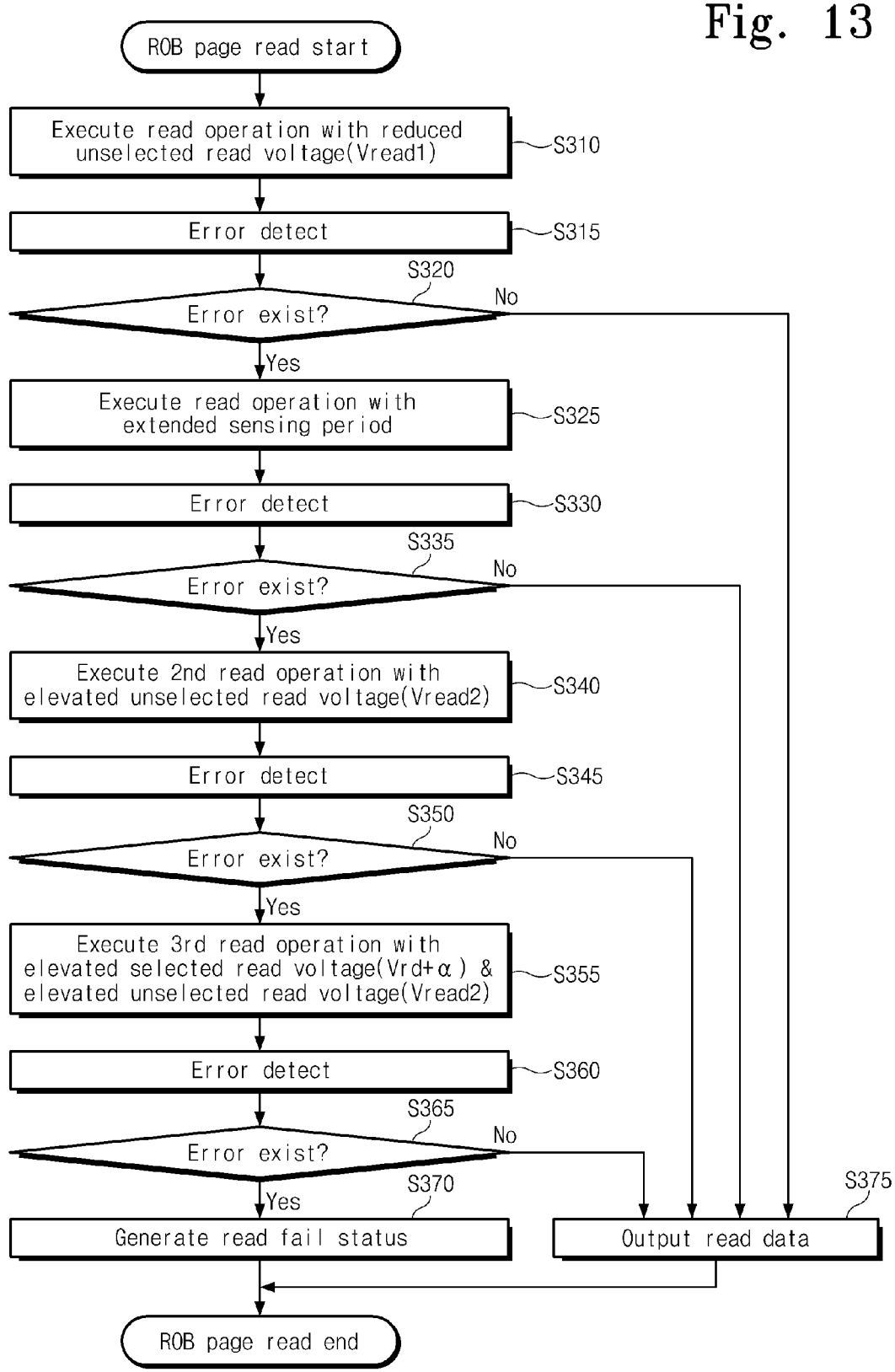
FIG. 13 is a flow chart summarizing in one embodiment of the invention a read operation performed by the flash memory device of FIG. 12.

FIG. 13 is a flow chart summarizing a read operation performed in relation to flash memory device of FIG. 12. Referring to FIG. 13, during the read operation, ECC block 640 is assumed to conduct error detection only without error correction.

If an address received as part of a host command indicates memory cells identified in ROB area 612, a read operation begins to a selected page of the ROB area 612. First, the read operation to the selected page is performed under the control of state machine 650. The selective read voltage Vrd is applied to a selected word line of a selected block, while the reduced unselective read voltage Vread1 is applied to unselected word lines. Page data read under these bias conditions is sensed and latched by page buffer 620 and transferred to ECC block 640 (S310). ECC block 640 detects error bits in the read page data (S315). ECC block 640 then determines whether an error bit exists in the read page data (S320). Unless an error bit is detected, the read page data is output to the host or some other external circuit (S375).

If, however, the read data includes an error bit, ECC block 640 outputs the correction fail signal ECC_fail and a first read retry operation is performed (S325). When the first correction fail signal ECC_fail is generated, read retry controller 690 outputs a first read-retry signal RRStep_1 to state machine 650. State machine 650 controls the execution of a first read retry operation using an extended bit-line sensing time in response to the first read-retry signal RRStep_1 (S325). First reread page data is transferred to ECC block 640 as a result. Then, ECC block 640 detects whether there is an error bit in the first reread page data (S330).

If no error bit is detected, the read data is output (S375). However, if an error bit is present in the first reread page data, state machine 650 adjusts the level of the unselective read voltage Vread to generate the elevated unselective read voltage Vread2, and a second read retry operation is performed using this voltage (S340). That is, state machine 650 controls high voltage generator 660 and page buffer 620 to execute the second read retry operation using the elevated unselective read voltage Vread2 (about 4.5V) in response to a second read-retry signal RRStep_2 (S340). The second reread page data is then transferred to ECC block 640 and error bit detection is again performed in relation to the second reread page data (S345).

If ECC block 640 determines that no error bit is present in the second reread page data (S350=no), then the read data is output (S375). However, if an error bit is still detected from the second reread page data, ECC block 640 again communicates the correction fail signal ECC_fail to read retry controller 690, and read retry controller 690 provides a third read-retry signal RRStep_3 to state machine 650 indicating a third read fail. State machine 650 then controls high voltage generator 660 and page buffer 620 to again read the indicated page data using no only elevated unselective read voltage Vread2, but also elevated selective read voltage Vrd+α in response to the third read-retry signal RRStep_3 (S355).

As a result, third reread page data is latched in page buffer 620 and transferred to ECC block 640. ECC block 640 detects whether error bits are present in the third reread page data (S360). If not, the read data is output (S375). However, is ECC block 640 determines that an error bit is present in the third reread page data (S365=yes), then a read fail outcome is indicted by memory system 600 (e.g., a fourth read-retry signal RRStep_4 received by state machine 640 generates a status signal iStatus indicating a read fail status (S370).

As aforementioned in conjunction with FIG. 13, the illustrated method embodiment may be performed in a memory system comprising ECC circuitry only capable of performing error detection without error correction. Since read operations directed to ROB area 612 are performed using a reduced unselective read voltage Vread1, the possibility of generating the soft-programming effect is reduced. Thus, the number of read operations (or read cycles in a read operation) may be increased in relation to memory cells included in ROB area 612 using variable read conditions (e.g., bias voltages).

Figure 14:
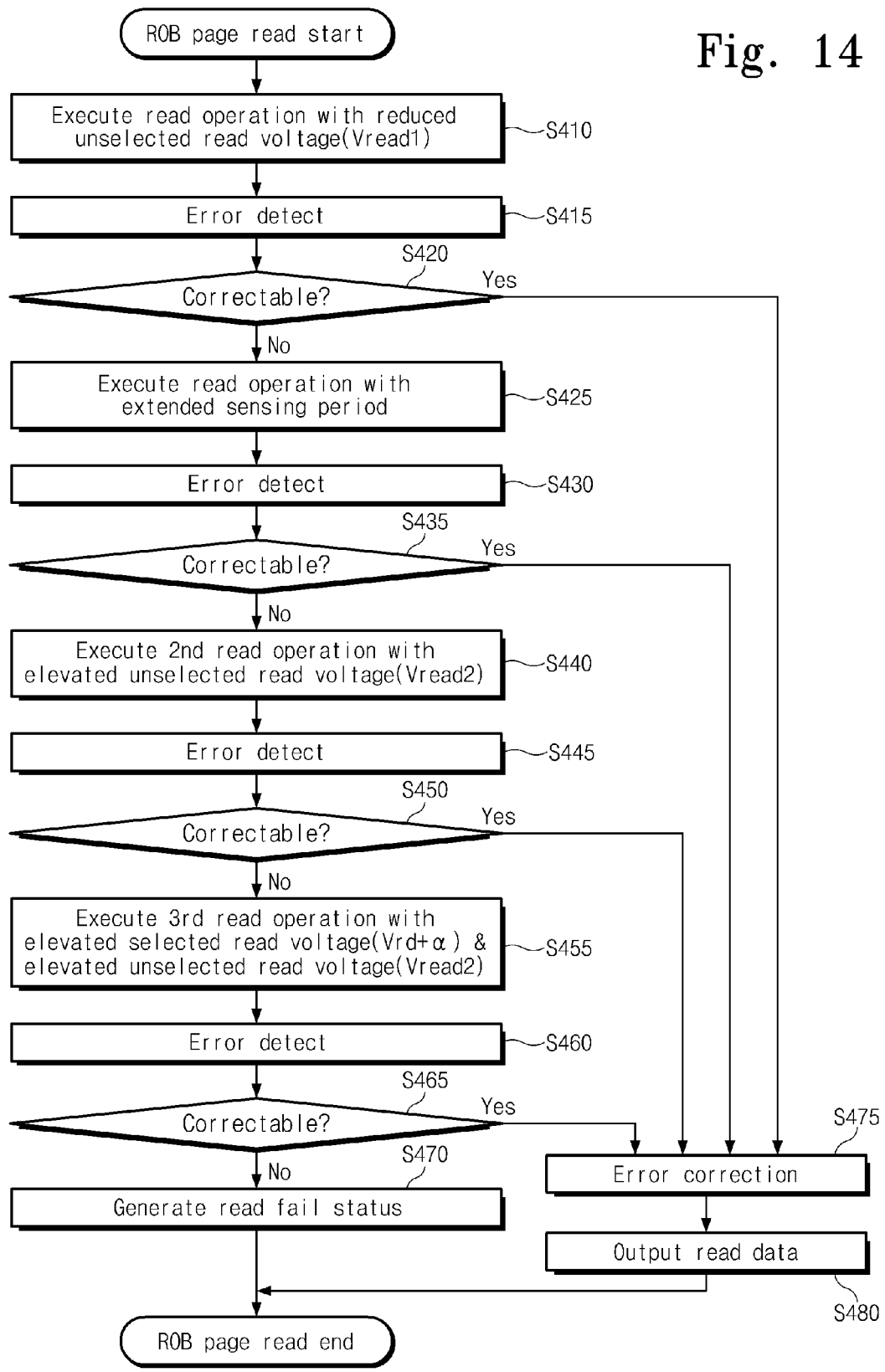
FIG. 14 is a flow chart summarizing in another embodiment of the invention a read operation performed by flash memory device of FIG. 12.

FIG. 14 is a flow chart summarizing another embodiment of a read operation performed by the flash memory device of FIG. 12, including error correction functionality performed by ECC block 640 in relation to read data.

The read operation for a selected page of the ROB area 612 begins in response to an address corresponding to the RON range information 611. The read operation progresses to the selected page in compliance with control by the state machine 650. During this, in a selected block, the selective read voltage Vrd is applied to a selected word line while the unselective read voltage Vread1 is applied to unselected word lines. Under this bias condition, readout page data is sensed and latched by the page buffer 620 and then transferred to the ECC block (S410). The ECC block 640 detects error bits from the page data transferred thereto (S415). The ECC block 640 also determines whether the detected number of error bits is within a correctable range (S420). If the number of error bits is within the correctable range (or the error correction capacity) of the ECC block 640, the ECC block 640 executes the operation of error correction with the detected error bits (S475). To the contrary, if the number of error bits is out of the correctable range of the ECC block 640, the ECC block 640 outputs the correction fail signal ECC_fail and the procedure goes to a rereading step S425. Responding to the first generation of the correction fail signal ECC_fail, the read retry controller 690 outputs the first read-retry signal RRStep_1 to the state machine 650. The state machine 650 enables the reread operation with a lengthened bit-line sensing time in response to the first read retry signal RRStep_1 (S425). Reread page data is transferred to the ECC block 640. The ECC block 640 detects error bits from the reread page data (S430). And, the ECC block 640 determines whether the number of detected error bits is within the correctable range (or the error correction capacity) thereof (S435). If the errors of the page data reread out for the lengthened bit-line sensing time are determined as being correctable, the ECC block 640 begins the operation of error correction (S475) and the page data is output without error (S480).

On the other hand, if the number of error bits included in the page data read out by the first reread operation is over the error correction capacity of the ECC block 640, the ECC block 640 outputs the correction fail signal ECC_fail and the read retry controller 690 outputs the second read-retry signal RRStep_2 to the state machine 650. The state machine 650 enables the reread operation with the unselective read voltage Vread2 in response to the second read-retry signal RRStep_2

(S440). Reread page data is transferred to the ECC block 640. The ECC block 640 detects error bits from the reread page data (S445). The ECC block 640 determines whether the number of detected error bits is within the correctable range thereof (S450). If the detected error bits of the page data reread out by an increased level of the unselective read voltage Vread2 are determined as being correctable, the ECC block 640 begins the operation of error correction (S475). But of the number of error bits is still over the correctable range, the ECC block 640 transfers the correction fail signal ECC_fail to the read retry controller 690. The read retry controller 690 provides the third read-retry signal RRStep_3 to the state machine 650 in the second read fail condition. The state machine 650 controls the high voltage generator 660 and the page buffer 630 to resume the read operation by means of the increased selective read voltage Vrd+α in response to the third read-retry signal RRStep_3 (S455). Third reread page data latched in the page buffer 620 is transferred to the ECC block 640. The ECC block 640 detects error bits from the reread page data (S460). And, the ECC block 640 determines whether the detected error bits are correctable in the error correction capacity thereof (S465). If the number of error bits is within the correctable range, the procedure goes to an error correction step S475. But if the number of error bits is over the error correction capacity, the ECC block 640 reissues the correction fail signal ECC_fail to the read retry controller 690. The read retry controller 690 generates the fourth read-retry signal RRStep_4 in response to the fourth correction fail signal ECC_fail. The state machine generates and writes a read fail message in a status register (not shown) in response to the fourth read-retry signal RRStep_4.

According to the aforementioned reading method shown in FIG. 14, the procedure is carried out to first conduct the operation of error correction to data that is read out from the ROB area by means of the low unselective read voltage Vread1. If there is an error bit that cannot be repaired by the ECC block 640, it resumes the read operation with a lengthened bit-line sensing time under the same word-line bias condition. Afterward, if the number of error bits is still over the correctable range, the read operation is further resumed by means of the unselective read voltage Vread2 and the increased selective voltage Vrd+α. Even in the case of rereading page data with the unselective read voltage Vread2 and the increased selective voltage Vrd+α, an error correction step is included therein. Accordingly, the soft-programmed effect can be interrupted therefrom because the read operation to the ROB area 612 is carried out in the first time. As a result, it greatly increases the available number of reading cycles to memory cells of the ROB area 612. Here, the sequence of the reread operations may be not restrictive to the aforementioned embodiments.

Figure 15:
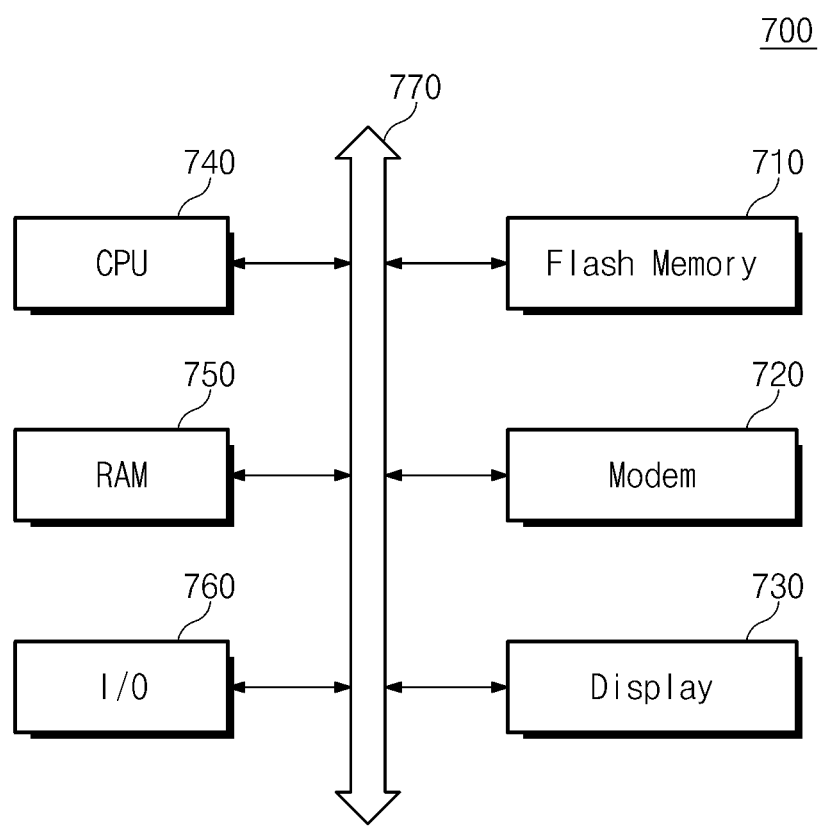
FIG. 15 is a block diagram illustrating a functional structure of a computational logic system in accordance with an embodiment of the invention.

FIG. 15 is a block diagram illustrating a computational logic platform 700 (e.g., an information processing system, a mobile electronic device, etc.) incorporating a flash memory device or a flash memory system 710 in accordance with an embodiment of the invention. Referring to FIG. 15, flash memory system 710 may be embedded in computational platform 700. This particular embodiment to the invention may comprise by a modem 720, a display unit 730, a central processing unit (CPU) 740, a random access memory (RAM) 750, and an input/output unit 760, all of which are electrically connected flash memory system 710 by way of a system bus 770. Flash memory system 710 may be configured substantially same as the aforementioned memory system or flash memory system. Flash memory system 710 may store data which are provided through input/output unit 760, or which are processed or to be processed by CPU 740.

Flash memory system 710 may be even configured in a solid state drive or disk (SSD). In this configuration, computational platform 700 is able to store a large amount of data in flash memory system 710 using high speed data access operations. It is thus possible to provide computational logic platform 700 with highly reliable data from flash memory system 710. Although not shown in FIG. 15, computational logic platform 700 may further comprise an application specific chipset, a camera image processor (e.g., complementary metal-oxide-semiconductor (CMOS) image sensor; i.e., CIS), a user interface, etc.

Flash memory device or system 710 or the memory system may be mounted on a printed circuit board associated with computational logic platform 700 by means of various packaging types. For instance, flash memory system 710 or the memory system may be placed thereon by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

The above-disclosed subject matter is to be considered illustrative, and not restrictive, and the appended claims are intended to cover all such modifications, enhancements, and other embodiments, which fall within the scope of the invention, as defined by the following claims. Thus, to the maximum extent allowed by law, the scope of the present invention is to be determined by the broadest permissible interpretation of the following claims and their equivalents.

What is claimed is:

1. A method operable within a nonvolatile memory system including a memory cell array, the method comprising:
   receiving programming commands each including program data and indicating execution of the programming command using a fast programming mode or a normal programming mode, wherein at least one of the received programming commands indicates the fast programming mode and at least one other of the received programming commands indicates the normal programming mode;
   in response to receipt of each programming command indicating the fast programming mode, activating a multi-bit Error Detection and/or Correction (ECC) engine to generate multi-bit ECC code in relation to the program data and storing the program data and multi-bit ECC data in the memory cell array; and
   in response to receipt of each programming command indicating the normal programming mode is indicated, activating a single bit ECC engine to generate single bit ECC code in relation to the program data and storing the program data and single bit ECC data in the memory cell array.

2. The method of claim 1, further comprising:
   when the normal programming mode is indicated, generating a program voltage beginning at a first start voltage and using the program voltage to store the program data and the single bit ECC data in the memory cell array; and
   when the fast programming mode is indicated generating the program voltage beginning at a second start voltage higher than the first start voltage and using the program voltage to store the program data and the multi-bit ECC data in the memory cell array.

3. The method of claim 2, wherein the receiving programming commands comprises:
generating an internal address associated with the program data in relation to a received programming command;
comparing the internal address to address information stored in an address area of the memory cell array; and
determining whether the fast programming mode or the normal programming mode is indicated in relation to the comparison of the internal address with the address information.

4. The method of claim 3, further comprising:
receiving an externally generated command in the nonvolatile memory system corresponding to the received programming command; and
separating the internal address from the externally generated command.

5. The method of claim 3, wherein the address information indicates addresses in the memory cell array corresponding to a normal area and a fast area;
storing the program data and the multi-bit ECC code in the fast programming mode comprises storing at least the program data in the fast area using the program voltage beginning with the second start voltage; and
storing the program data and the single bit ECC code in the normal programming mode comprises storing at least the program data in the normal area using the program voltage beginning with the first start voltage.

6. The method of claim 3, further comprising:
copying the address information from the address area of the memory cell array to an address comparator during a system boot operation for the nonvolatile memory.

7. The method of claim 6, wherein the address area further stores initialization information for the nonvolatile memory system accessed during the system boot operation.

8. A method operable within a nonvolatile memory system including a memory cell array, the method comprising:
receiving read commands each indicating read data stored in the memory cell array and further indicating execution of the read command using a fast read mode or a normal read mode, wherein at least one of the received read commands indicates the fast read mode and at least one other of the received programming commands indicates the normal read mode;
in response to receipt of each read command indicating the fast read mode, activating a multi-bit Error Detection and/or Correction (ECC) engine to detect/correct an error bit in the read data using multi-bit ECC code stored in the memory cell array; and
in response to receipt of each read command indicating the normal read mode, activating a single bit ECC engine to detectcorrect an error bit in the read data using single bit ECC code stored in the memory cell array.

9. The method of claim 8, wherein the receiving read commands comprises:
generating an internal address associated with the read data in relation to a received read command;
comparing the internal address to address information stored in an address area of the memory cell array; and
determining whether the fast read mode or the normal read mode is indicated in relation to the comparison of the internal address and the address information.

10. The method of claim 9, further comprising:
receiving an externally generated command in the nonvolatile memory system corresponding to the received read command; and
separating the internal address from the externally generated command.

11. The method of claim 9, wherein the address information indicates addresses in the memory cell array corresponding to a normal area and a fast area;
reading the read data and the multi-bit ECC code in the fast read mode comprises reading at least the read data from the fast area; and
reading the read data and the single bit ECC code in the normal read mode comprises reading at least the read data from the normal area.

12. The method of claim 9, further comprising:
copying the address information from the address area of the memory cell array to an address comparator during a system boot operation for the nonvolatile memory.

13. The method of claim 12, wherein the address area further stores initialization information for the nonvolatile memory system accessed during the system boot operation.

14. The method of claim 9, wherein when the fast read mode is indicated, and the method further comprises:
after reading the read data and the multi-bit ECC data from the memory cell array, determining whether an error is present in the read data using the multi-bit ECC data; and
if the error is correctable using the multi-bit ECC data, performing an error correction operation using the multi-bit ECC data to correct the error; or
if the error is not correctable using the multi-bit ECC data. performing a first read retry operation on the read data stored in the memory cell array using an extended bit-line sensing time to provide first reread data.

15. The method of claim 14, further comprising:
determining whether an error is present in the first reread data using the multi-bit ECC data; and
if the error is correctable using the multi-bit ECC data, performing an error correction operation using the multi-bit ECC data to correct the error; or
if the error is not correctable using the multi-bit ECC data, performing a second read retry operation on the read data stored in the memory cell array using an elevated read voltage capable of compensating for a threshold voltage increment for over-programmed memory cells in the memory cell array.

16. The method of claim 9, wherein when the fast read mode is indicated, and the method further comprises:
after reading the read data and the multi-bit ECC data from the memory cell array using a reduced unselected read voltage, detecting whether an error is present in the read data using the multi-bit ECC data; and
if an error is detected, performing a first read retry operation using an extended bit-line sensing time to provide first reread data.

17. The method of claim 16, further comprising:
determining whether an error is present in the first reread data using the multi-bit ECC data; and
if an error is detected, performing a second read retry operation on the read data stored in the memory cell array using an elevated unselected read voltage to provide second reread data.

18. The method of claim 17, further comprising:
determining whether an error is present in the second reread data using the multi-bit ECC data; and
if an error is detected, performing a third read retry operation on the read data stored in the memory cell array using both the elevated unselected read voltage and an elevated selected read voltage.

19. The method of claim 17, further comprising:
determining whether an error is present in the second reread data using the multi-bit ECC data; and
if an error is detected and determined to fall within the ECC capabilities of the nonvolatile memory system, correcting the error and outputting the second reread data;
else performing a third read retry operation on the read data stored in the memory cell array using both the elevated unselected read voltage and an elevated selected read voltage.

20. The method of claim 16, further comprising:
determining whether an error is present in the first reread data using the multi-bit ECC data; and
if an error is detected and determined to fall within the ECC capabilities of the nonvolatile memory system, correcting the error and outputting the first reread data;
else performing a second read retry operation on the read data stored in the memory cell array using an elevated unselected read voltage to provide second reread data.

21. The method of claim 9, wherein when the fast read mode is indicated, and the method further comprises:
after reading the read data and the multi-bit ECC data from the memory cell array using a reduced unselected read voltage, detecting whether an error is present in the read data using the multi-bit ECC data; and
if an error is detected and determined to fall within the ECC capabilities of the nonvolatile memory system, correcting the error and outputting the read data;
else performing a first read retry operation using an extended bit-line sensing time to provide first reread data.

22. A system comprising:
a host configured to provide programming commands each including program data and indicating execution of a programming operation associated with the program data in either a fast programming mode or a normal programming mode; and
a flash memory device configured to receive the programming commands from the host, wherein at least one of the received programming commands indicates the fast programming mode and at least one other of the received programming commands indicates the normal programming mode,
the flash memory device further configured, in response to each received programming command indicating the normal programming mode, to execute the programming operation in the normal programming mode by generating single bit Error Detection and/or Correction (ECC) code associated with the program data, and storing the program data and single bit ECC data in a memory cell array using a first program voltage having a first start voltage,
the flash memory device further configured, in response to each received programming command indicating the fast programming mode, to execute the programming operation in the fast programming mode by generating multi-bit ECC code associated with the program data, and storing the program data and multi-bit ECC data in the memory cell array using a second program voltage having a second start voltage higher than the first start voltage.

23. The system of claim 22, wherein the flash memory device comprises:
the memory cell array;
a high voltage generator applying either the first program voltage or the second program voltage to a selected word line in the memory cell array;
an ECC block generating either the single bit ECC code or the multi-bit ECC code; and
a state machine controlling the high voltage generator and the ECC block in relation to either the fast programming mode or the normal programming mode.

24. The system claim 23, wherein the ECC block comprises:
a single bit ECC engine generating the single bit ECC code in relation to the program data during the normal programming mode; and
a multi-bit ECC engine generating the multi-bit ECC code in relation to the program data during the fast programming mode.

25. The system of claim 24, wherein the ECC block further comprises:
a program selector providing the program data to either the single-bit ECC engine or the multi-bit ECC engine; and
a multiplexer selecting either the single-bit ECC code or the multi-bit ECC code.

26. The system of claim 24, wherein the state machine is configured to control the ECC block to activate the multi-bit ECC engine during the fast programming mode and is further configured to control the high voltage generator to generate the program voltage having the second start level during the fast programming mode.

27. The system of claim 23, wherein the memory cell array is divided into a fast area storing program data during the fast programming mode and a normal area storing program data during the normal programming mode.

28. The system of claim 27, wherein the host indicates either the fast programming mode or the normal programming mode on the basis of a comparison between an address associated with the program data, and addresses in the fast area and the normal area of the memory cell array.

29. The system of claim 28, wherein the flash memory device further comprises:
an address comparator generating a fast mode signal in relation to the comparison between the address associated with the program data, and addresses in the fast area and the normal area of the memory cell array;
wherein the state machine, the ECC block, and the high voltage generator respectively operate in relation to either the fast programming mode or the normal programming mode in response to the active inactive state of the fast mode signal.

30. The system of claim 29, wherein the memory cell array further comprises an address area storing address information related to at least one of the fast area and the normal area.

31. The system of claim 30, wherein the address comparator stores the address information received from the address area upon execution of a system boot operation.

32. A flash memory device comprising:
a memory cell array having memory cells divided into a first area and a second area;
an address comparator generating a flag signal upon determining that an address associated with a read operation corresponds to the first area;
a high voltage generator providing unselected word lines of the memory cell array with a reduced unselective read voltage or an elevated unselective read voltage, during the read operation in relation to the flag signal;
a page buffer sensing bit lines of the memory cell array using a first bit-line sensing period or a second bit-line sensing period longer than the first bit-line sensing period during the read operation;
an ECC block detecting and/or correcting an error in the read data as provided by the page buffer and generating a read fail signal if a number of error bits in the error exceeds a correction capacity of the ECC block; and a state machine controlling the high voltage generator and the page buffer in response to the flag signal and the read fail signal.

33. The flash memory device of claim 32, wherein the first area is associated with frequently read memory cells or a frequently read memory block.

34. The flash memory device as set forth in claim 33, wherein the first area comprises a memory cell array region storing address information associated with the first area.

35. The flash memory device of claim 34, wherein the address comparator is configured to store the address information.

36. The flash memory device of claim 35, wherein the address information read from the memory cell array and stored in the address comparator during a boot operation.

37. The flash memory device of claim 32, further comprising:

a read retry controller counting read fail signals generated by the ECC block and enabling the state machine to reread the read data using an extended data sensing period.

38. The flash memory device of claim 37, wherein the read retry controller further enables the state machine to reread the read data by varying the read voltages applied to selected and unselected word lines in response to each read fail signal.

39. The flash memory of claim 38, wherein the state machine enables the high voltage generator and the page buffer to apply the reduced unselected read voltage during a first read operation.

40. The flash memory of claim 39, wherein the state machine enables the high voltage generator and the page buffer to apply the elevated unselected read voltage during second and subsequent read operations.

41. A program method of a nonvolatile memory device which includes a memory cell array having a first memory region and a second memory region, the method comprising:

selecting a memory region to store write data among the first memory region and the second memory region according to an address of the write data;

selecting one of a first error correction code and a second error correction code according to the selected memory region;

applying the selected error correction code to the write data; and programming a coded write data to the selected memory region, wherein a correction capability of the second error correction code is higher than a correction capability of the first error correction code, wherein a program start voltage level corresponding to the second memory region is higher than a program start voltage level corresponding to the first memory region.

42. The method of claim 41, wherein during the programming the coded write data to the selected memory region, the coded write data coded by the first error correction code is programmed into the first memory region, and the coded write data coded by the second error correction code is programmed into the second memory region.

43. The method of claim 41, wherein a number of data bit stored in each of the memory cells of the second memory region is larger than a number of data bit stored in each of the memory cells of the first memory region.

44. The method of claim 41, wherein a program time corresponding to the second memory region is longer than a program time corresponding to the first memory region.

45. The method of claim 41, wherein a number of program loop count applied to the second memory region is larger than a number of program loop count applied to the first memory region.

46. The method of claim 41, further comprising:

decoding the address of the write data.

47. The method of claim 41, wherein the first memory region is in data communication with the second memory region.

* * * * *